United States Patent
Weiland et al.

(10) Patent No.: US 11,686,597 B2
(45) Date of Patent: Jun. 27, 2023

(54) MAGNETIC FIELD SENSORS AND OUTPUT SIGNAL FORMATS FOR MAGNETIC FIELD SENSORS

(71) Applicant: Allegro MicroSystems, LLC, Manchester, NH (US)

(72) Inventors: Dominik Weiland, Sandhausen (DE); Marcus Hagn, Taufkirchen (DE); Dominik Geisler, Heidelberg (DE)

(73) Assignee: Allegro MicroSystems, LLC, Manchester, NH (US)

( * ) Notice: Subject to any disclaimer, the term of this patent is extended or adjusted under 35 U.S.C. 154(b) by 485 days.

(21) Appl. No.: 16/434,649

(22) Filed: Jun. 7, 2019

(65) Prior Publication Data
US 2020/0386575 A1 Dec. 10, 2020

(51) Int. Cl.
*G01D 5/14* (2006.01)
*G01P 3/487* (2006.01)
(Continued)

(52) U.S. Cl.
CPC ............ *G01D 5/14* (2013.01); *G01D 5/145* (2013.01); *G01P 3/487* (2013.01); *G01P 13/045* (2013.01); *G01R 33/028* (2013.01)

(58) Field of Classification Search
CPC .......... G01D 5/14; G01D 5/142; G01D 5/145; G01D 5/147; G01D 5/16; G01D 5/165;
(Continued)

(56) References Cited

U.S. PATENT DOCUMENTS 4,355,364 A * 10/1982 Gudat .................. G01P 13/045
324/166
4,848,531 A 7/1989 Gray et al.
(Continued)

FOREIGN PATENT DOCUMENTS

DE 19634714 A1 3/1998
DE 19650935 A1 6/1998
(Continued)

OTHER PUBLICATIONS

Extended European Search Report dated Oct. 28, 2020 for European Application No. 20172916.7; 8 pages.
(Continued)

*Primary Examiner* — David M Schindler
(74) *Attorney, Agent, or Firm* — Daly, Crowley, Mofford & Durkee, LLP

(57) ABSTRACT

An apparatus and a method provide an output signal indicative of a speed of rotation and/or a direction of movement of a ferromagnetic object. The sensor includes at least one magnetic field sensing element configured to generate a magnetic field signal in response to a magnetic field associated with an object. The sensor includes a detector configured to generate a detector signal having edges occurring in response to a comparison of the magnetic field signal and the threshold signal. The sensor includes an output circuit configured to generate an output signal having a first format when a characteristic of the magnetic field signal is within a first range and having a second format different than the first format when the characteristic of the magnetic field signal is within a second range, different than the first range.

14 Claims, 13 Drawing Sheets

(51) Int. Cl.
*G01P 13/04* (2006.01)
*G01R 33/028* (2006.01)

(58) Field of Classification Search
CPC .... G01P 3/44; G01P 3/48; G01P 3/481; G01P 3/487; G01P 3/488; G01P 3/49; G01P 13/04; G01P 13/045; G01R 33/028; G01R 33/06; G01R 33/07; G01R 33/072; G01R 33/075; G01R 33/077; G01R 33/09; G01R 33/091; G01R 33/093; G01R 33/095; G01R 33/096; G01R 33/098; G01B 7/30
See application file for complete search history.

(56) References Cited

U.S. PATENT DOCUMENTS

| | | | |
|---|---|---|---|
| 5,357,147 A * | 10/1994 | Ina | H03K 5/19 |
| | | | 327/100 |
| 5,554,948 A * | 9/1996 | Hansen | G01P 3/489 |
| | | | 324/166 |
| 6,288,567 B1 | 9/2001 | Fink | |
| 6,542,847 B1 | 4/2003 | Lohberg et al. | |
| 6,687,644 B1 | 2/2004 | Zinke et al. | |
| 6,815,944 B2 | 11/2004 | Vig et al. | |
| 6,968,484 B2 | 11/2005 | Hummel | |
| 7,091,876 B2 | 8/2006 | Steger | |
| 7,319,418 B2 | 1/2008 | Fink | |
| 8,183,982 B2 | 5/2012 | Scherr | |
| 8,519,819 B2 | 8/2013 | Scherr | |
| 8,624,588 B2 | 1/2014 | Vig et al. | |
| 8,922,331 B2 | 12/2014 | Scherr | |
| 2003/0001563 A1 | 1/2003 | Turner | |
| 2005/0211002 A1 | 9/2005 | Hara et al. | |
| 2009/0102469 A1* | 4/2009 | Bailey | G01H 1/003 |
| | | | 324/207.25 |
| 2014/0182374 A1* | 7/2014 | Oh | G01P 3/487 |
| | | | 73/494 |
| 2017/0219662 A1 | 8/2017 | Prentice et al. | |
| 2017/0261530 A1* | 9/2017 | Schophuis | G01P 3/36 |
| 2017/0336225 A1 | 11/2017 | Burdette et al. | |
| 2019/0025080 A1 | 1/2019 | Doogue et al. | |
| 2019/0025081 A1 | 1/2019 | Kerdraon et al. | |
| 2019/0025082 A1 | 1/2019 | Kerdraon et al. | |
| 2019/0025083 A1 | 1/2019 | Pepka et al. | |
| 2019/0025084 A1 | 1/2019 | Doogue et al. | |
| 2019/0107587 A1 | 4/2019 | Stewart | |

FOREIGN PATENT DOCUMENTS

| | | |
|---|---|---|
| DE | 19911774 A1 | 12/1999 |
| EP | 0944888 B1 | 10/2001 |
| JP | 4142109 B2 | 8/2008 |
| KR | 20140047437 A | 4/2014 |
| WO | WO 9825148 A2 | 6/1998 |

OTHER PUBLICATIONS

Response to European Office Action dated Dec. 14, 2020 for European Application No. 20172916.7; Response filed on Jun. 7, 2021; 21 Pages.
U.S. Appl. No. 15/982,268, filed May 17, 2018, Hyungsok, et al.
European Examination Report dated Aug. 3, 2022 for European Application No. 20172916.7; 7 pages.
European Response to Examination Report dated Aug. 3, 2022 for European Application No. 20172916.7 filed on Dec. 8, 2022, 13 pages.

* cited by examiner

MAGNETIC FIELD SENSORS AND OUTPUT SIGNAL FORMATS FOR MAGNETIC FIELD SENSORS

CROSS REFERENCE TO RELATED APPLICATIONS

Not Applicable.

STATEMENT REGARDING FEDERALLY SPONSORED RESEARCH

Not Applicable.

FIELD

This disclosure relates generally to integrated circuits and, more particularly, to magnetic field sensors for detecting and communicating a speed of motion and/or a direction of motion of an object.

BACKGROUND

Proximity detectors for detecting ferromagnetic objects are known. In proximity detectors, a magnetic field affected by movement of the object is detected by a magnetic field sensing element, such as a Hall effect element or a magnetoresistance element, which provides a signal (i.e., a magnetic field signal or sensing element signal) proportional to a detected magnetic field.

Some types of magnetic field sensors, i.e., proximity detectors, merely provide an output signal representative of the proximity of a ferromagnetic object. However, other types of magnetic field sensors, i.e., rotation detectors, provide an output signal representative of the approach and retreat of each tooth of a rotating ferromagnetic gear or of each segment of a segmented ring magnet having segments with alternating polarity as the gear or ring magnet rotates. The rotation detector processes the magnetic field signal to generate an output signal that changes state each time the magnetic field signal either reaches a value near to a peak (positive or negative peak) or crosses a threshold level. Therefore, the output signal, which has an edge rate or period, is indicative of a rotation and a speed of rotation of the ferromagnetic gear or of the ring magnet.

One type of rotation detector can compare a sinusoidal signal generated by a sensing element to a threshold. In some types of rotation detectors, a peak-to-peak percentage detector (or threshold detector) generates at least one threshold level that is equal to a percentage of the peak-to-peak magnetic field signal detected by one or more magnetic field sensing elements. For this type of rotation detector, the output signal changes state when the magnetic field signal crosses at least one threshold level. One such threshold detector is described in U.S. Pat. No. 5,917,320 entitled "Detection of Passing Magnetic Articles While Periodically Adapting Detection Threshold" assigned to the assignee of the present disclosure and incorporated herein by reference.

In another type of rotation detector, a slope-activated detector, also referred to as a peak-referenced detector (or peak detector), threshold levels are identified that differ from the positive and negative peaks (i.e., the peaks and valleys) of the sensing element signal by a predetermined amount. Thus, in this type of rotation detector, the output signal changes state when the magnetic field signal departs from a peak and/or valley by the predetermined amount. One such peak detector is described in U.S. Pat. No. 6,091,239 entitled "Detection Of Passing Magnetic Articles With a Peak Referenced Threshold Detector," which is assigned to the assignee of the present disclosure and incorporated herein by reference. Another such peak detector is described in U.S. Pat. No. 6,693,419, entitled "Proximity Detector," which is assigned to the assignee of the present disclosure and incorporated herein by reference. Another such peak detector is described in U.S. Pat. No. 7,199,579, entitled "Proximity Detector," which is assigned to the assignee of the present disclosure and incorporated herein by reference.

It should be understood that, because the above-described peak-to-peak percentage detector (threshold detector) and the above-described peak-referenced detector (peak detector) both have circuitry that can identify the positive and negative peaks of a magnetic field signal, the peak-to-peak percentage detector and the peak-referenced detector both include a peak detector circuit configured to detect a positive peak and a negative peak of the magnetic field signal. Each, however, uses the detected peaks in different ways.

In order to accurately detect the positive and negative peaks of a magnetic field signal, some rotation detectors are capable of tracking at least part of the sensing element signal (magnetic field signal). To this end, typically, one or more digital-to-analog converters (DACs) can be used to generate a tracking signal, which tracks the magnetic field signal. For example, in the above-referenced U.S. Pat. Nos. 5,917,320 and 6,091,239, two DACs are used, one (PDAC) to detect the positive peaks of the magnetic field signal and the other (NDAC) to detect the negative peaks of the magnetic field signal.

As described above, an output signal generated by a conventional proximity detector used to detect a rotation of a ferromagnetic object (e.g., a ring magnet or a ferromagnetic gear) can have a format indicative of the rotation and of the speed of rotation of the ferromagnetic object or ring magnet. For example, the conventional proximity detector can generate the output signal as a two-state binary signal having a frequency indicative of the speed of rotation. In some arrangements, the output signal can be comprised of voltage or current pulses, a rate of which is representative of speed of rotation, and a pulse width of which is indicative of direction of rotation. This arrangement is described, for example, in U.S. Pat. No. 6,815,944, issued Nov. 9, 2004, assigned to the assignee of the present disclosure, and incorporated by reference herein in its entirety.

In conventional rotation detectors, the above-described pulses are generated at a rate that features on a ferromagnetic object pass by the proximity detector. A variety of types and shapes of ferromagnetic objects can be used.

In some arrangements, the ferromagnetic object is a gear-like object having gear teeth and the magnetic field sensor, e.g., rotation detector, is a back-biased magnetic field sensor, which includes a magnet to generate a magnetic field proximate to the magnetic field sensor. Gear teeth passing by the magnetic field sensor cause changes in the magnetic field, and thus, the passing gear teeth can be sensed and the above-described pulses can be generated with a rate at which the gear teeth pass by.

In other arrangements, the object is a ring magnet having one or more north-south pole pairs. These arrangements do not need the back-biased arrangement and the north-south pole pairs passing by the proximity detector can be sensed and the above-described pulses can be generated with a rate at which the north-south pole pairs pass by the magnetic field sensor.

SUMMARY

The present disclosure can provide a motion detector (e.g., a rotation detector) that provides information regarding a moving or rotating object. Some embodiments combine information from multiple events (e.g., detector signal transitions) into a single output signal event (e.g., output signal pulse) in order to thereby allow high object speed information to be conveyed accurately.

In accordance with an embodiment, a magnetic field sensor includes at least one magnetic field sensing element configured to generate a magnetic field signal in response to a magnetic field associated with an object having a plurality of features, a detector responsive to the magnetic field signal and to a threshold signal and configured to generate a detector signal having edges occurring in response to a comparison of the magnetic field signal and the threshold signal and occurring at a rate corresponding to a speed of motion of the object, and an output circuit coupled to receive the detector signal and configured to generate an output signal having a first format when a characteristic of the magnetic field signal is within a first range and having a second format different than the first format when the characteristic of the magnetic field signal is within a second range, different than the first range.

The magnetic field sensor can include one or more of the following features alone or in combination. In the magnetic field sensor, the characteristic of the magnetic field signal can include a frequency of the magnetic field signal. The first output signal format can include a set amount of pulses for each feature of the object and the second output signal format can include a set amount of pulses for each feature of the object, different to the amount of pulses for each target feature in the first output signal format. The first range of the magnetic field signal can correspond to a low frequency range and the second range of the magnetic field signal can correspond to a high frequency range. Each feature of the object can include a pole pair of a ring magnet or a tooth valley pair of a gear. The output circuit can be further configured to provide an indication of the range of the magnetic field signal characteristic. The output signal can include the indication of the range of the magnetic field signal characteristic. The output signal can include a plurality of pulses and a pulse width of at least one of the plurality of pulses provides the indication of the range of the magnetic field signal characteristic. The output signal can include a plurality of pulses and a height of at least one of the plurality of pulses can provide the indication of the range of the magnetic field signal characteristic. The output signal can include at least a first pulse and a second pulse and a time between a falling edge of the first pulse and a rising edge of the second pulse can provide the indication of the range of the magnetic field signal characteristic. The output signal can include at least a single pulse having a pulse width that provides the indication of the range of the magnetic field signal characteristic. The output circuit can be configured to generate a second output signal including the indication of the range of the magnetic field signal characteristic. The first output signal can be configured to transmit information about the speed of motion of the object. A voltage level or a current level of the second output signal can provide the indication of the range of the magnetic field signal characteristic. A phase delay between the first output signal and the second output signal can provide the indication of the range of the magnetic field signal characteristic. The sensor can include a plurality of magnetic field sensing elements, each configured to generate a magnetic field signal and a plurality of detectors, each responsive to one or more magnetic field signals and configured to generate a respective plurality of detector signals, wherein the output circuit is coupled to receive the plurality of detector signals and to provide an indication of a direction of motion of the object based on the plurality of detector output signals. The direction indication can include a first pulse width when the direction of motion of the object is a first direction and a second pulse width different than the first pulse width when the direction of motion of the object is a second direction.

In accordance with another embodiment, a method includes generating a magnetic field signal in response to a magnetic field associated with an object having a plurality of features, generating a detector signal having edges occurring in response to a comparison of the magnetic field signal and a threshold signal and occurring at a rate corresponding to a speed of motion of the object, and generating an output signal having a first format when a characteristic of the magnetic field signal is within a first range and having a second format different than the first format when the characteristic of the magnetic field signal is within a second range, different than the first range.

The magnetic field sensor can include one or more of the following features alone or in combination. The method can include setting a counter to a value, and incrementing the counter in response to the edges of the detector signal. An output pulse of the output signal can be provided when the counter reaches the value. The method can further include determining if the characteristic of the magnetic field signal is within the first range or the second range using an internal clock to determine the frequency with which the magnetic field signal changes.

In accordance with another embodiment, a magnetic field sensor includes means for generating a magnetic field signal in response to a magnetic field associated with an object having a plurality of features, means for generating a detector signal having edges occurring in response to a comparison of the magnetic field signal and a threshold signal and occurring at a rate corresponding to a speed of motion of the object, and means for generating an output signal having a first format when a characteristic of the magnetic field signal is within a first range and having a second format different than the first format when the characteristic of the magnetic field signal is within a second range, different than the first range.

DETAILED DESCRIPTION

Figure 1:
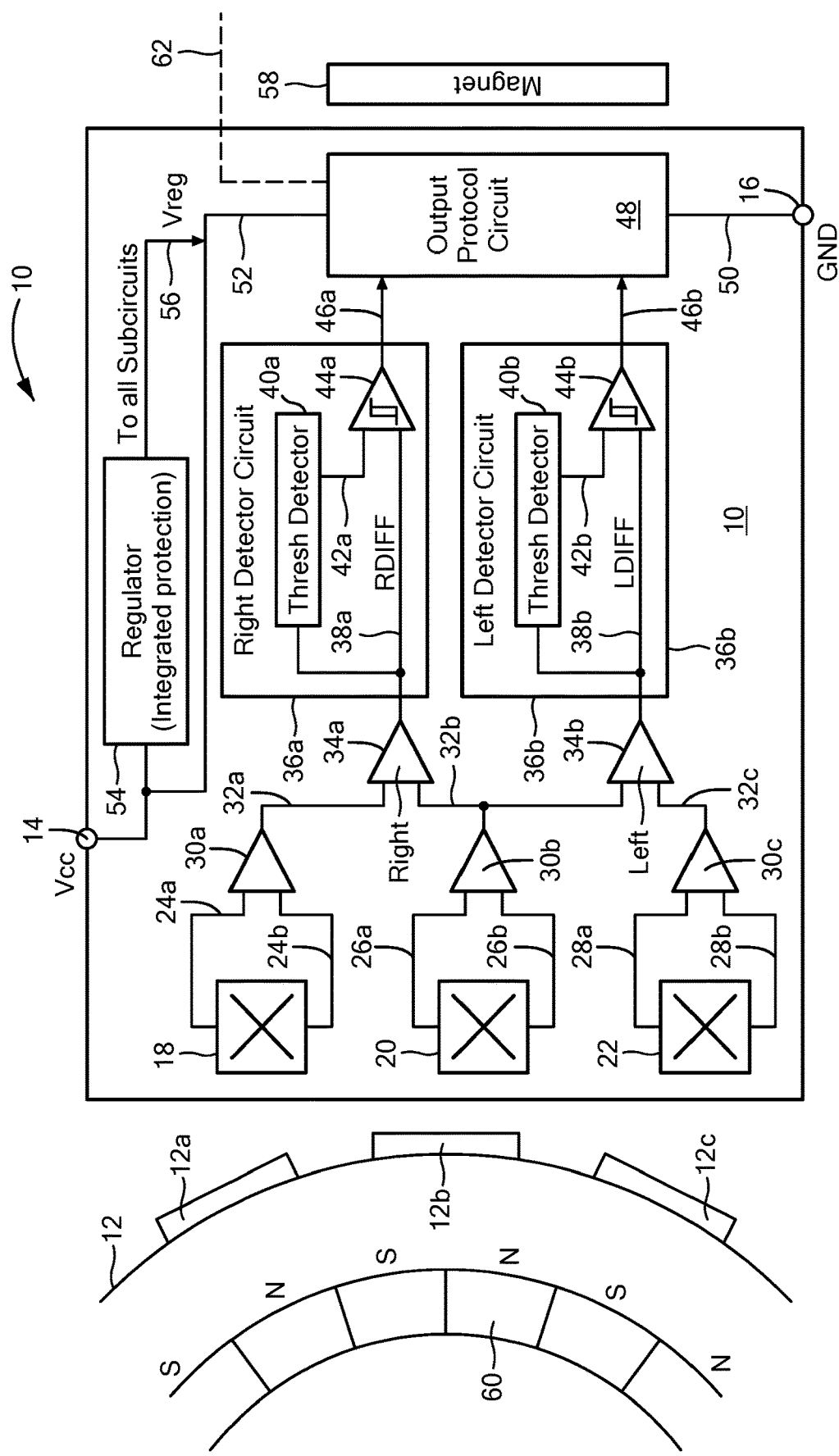
FIG. 1 is a block diagram of a magnetic field sensor for generating one or more magnetic field signals and for generating an output signal indicative of a speed and/or a direction of a rotation of an object, according to the present disclosure.

Before describing the present disclosure, some introductory concepts and terminology are explained. As used herein, the term "rotation detector" is used to describe a circuit that includes at least one "magnetic field sensing element," which detects a magnetic field. The rotation detector can sense movement, e.g., rotation, of a ferromagnetic object, for example, advance and retreat of magnetic domains of a ring magnet or advance and retreat of gear teeth of a ferromagnetic gear.

Similarly, the term "movement detector" can be used to describe either a rotation detector or used to describe a magnetic field sensor that can sense different movement, e.g., linear movement, of a ferromagnetic object, for example, linear movement of magnetic domains of a ring magnet or linear movement of gear teeth of a ferromagnetic gear. It will be appreciated that while embodiments are described herein as detecting speed and/or rotation of a rotating target object (i.e., rotation detectors), the principles are equally applicable for use in detecting linear or other types of target motion.

As used herein, the term "magnetic field sensing element" is used to describe a variety of electronic elements that can sense a magnetic field. The magnetic field sensing element can be, but is not limited to, a Hall effect element, a magnetoresistance element, or a magnetotransistor. As is known, there are different types of Hall effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, for example, a spin valve, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe a circuit that uses one or more magnetic field sensing elements, generally in combination with other circuits. The magnetic field sensor can be, for example, a rotation detector, a movement detector, a current sensor, or a proximity detector.

Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector (or movement detector) that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

The terms "parallel" and "perpendicular" are used in various contexts herein. It should be understood that the terms parallel and perpendicular do not require exact perpendicularity or exact parallelism, but instead it is intended that normal manufacturing tolerances apply, which tolerances depend upon the context in which the terms are used. In some instances, the term "substantially" is used to modify the terms "parallel" or "perpendicular." In general, use of the term "substantially" reflects angles that are beyond manufacturing tolerances, for example, within +/− ten degrees.

As used herein, the term "processor" is used to describe an electronic circuit that performs a function, an operation, or a sequence of operations. The function, operation, or sequence of operations can be hard coded into the electronic circuit or soft coded by way of instructions held in a memory device. A "processor" can perform the function, operation, or sequence of operations using digital values or using analog signals. In some embodiments, the "processor" can be embodied in an application specific integrated circuit (ASIC), which can be an analog ASIC or a digital ASIC. In some embodiments, the "processor" can be embodied in a microprocessor with associated program memory. In some embodiments, the "processor" can be embodied in a discrete electronic circuit, which can be an analog or digital. As used herein, the term "module" is used to describe a "processor." A processor can contain internal processors or internal modules that perform portions of the function, operation, or sequence of operations of the processor. Similarly, a module can contain internal processors or internal modules that perform portions of the function, operation, or sequence of operations of the module.

While electronic circuits shown in figures herein may be shown in the form of analog blocks or digital blocks, it will be understood that the analog blocks can be replaced by digital blocks that perform the same or similar functions and the digital blocks can be replaced by analog blocks that perform the same or similar functions. Analog-to-digital or digital-to-analog conversions may not be explicitly shown in the figures, but should be understood.

It should be understood that a so-called "comparator" can be comprised of an analog comparator having a two state output signal indicative of an input signal being above or below a threshold level (or indicative of one input signal being above or below another input signal). However the comparator can also be comprised of a digital circuit having an output signal with at least two states indicative of an input signal being above or below a threshold level (or indicative of one input signal being above or below another input signal), respectively, or a digital value above or below a digital threshold value (or another digital value), respectively.

As used herein, the term "predetermined," when referring to a value or signal, is used to refer to a value or signal that is set, or fixed, in the factory at the time of manufacture, or by external means, e.g., programming, thereafter. As used herein, the term "determined," when referring to a value or signal, is used to refer to a value or signal that is identified by a circuit during operation, after manufacture.

As used herein, the terms "line" and "linear" are used to describe either a straight line or a curved line. The line can be described by a function having any order less than infinite.

Ferromagnetic objects described herein can have a variety of forms, including, but not limited to, a ring magnet having one or more pole pair, and a gear having two or more gear teeth.

Signals with pulses are described herein as generated by a magnetic field sensor. In some embodiments, the signals are provided on a communication link to an external processor, for example, a CPU within an automobile, to further process the pulses.

As used herein, the term "pulse" is used to describe a signal that begins at a first level or state, transitions rapidly to a second level or state different than the first level, and returns rapidly to the first level.

Two channel magnetic field sensors are described below having two circuit channels. In general, the two channel magnetic field sensors can be capable of detecting and communicating both movement speed (e.g., rotation speed) and also motion direction (e.g., rotation direction) of a ferromagnetic object. However, it should be appreciated that a single channel magnetic field sensor can be capable of detecting and communicating movement speed (e.g., rotation speed).

Ferromagnetic gears are used in some examples below to show a rotating ferromagnetic object having ferromagnetic features, i.e., teeth. However, in other embodiments, the gear can be replaced with a ring magnet having at least one pole pair. Also, linear arrangements of ferromagnetic objects are possible that move linearly.

Referring to FIG. 1, an exemplary rotation detector 10 having two channels can be used, for example, to detect passing gear teeth, for example, gear teeth 12a-12c of a ferromagnetic gear 12. A permanent magnet 58 can be placed at a variety of positions proximate to the gear 12, resulting in fluctuations of a magnetic field proximate to the gear 12 as the gear 12 having the gear teeth 12a-12c rotates. Use of the above-described magnet results in a so-called "back-bias" arrangement.

In other embodiments, the magnet 58 and the gear 12 can be omitted. Instead, the rotation detector 10 can be used to detect a rotation of a ring magnet 60 having at least one north pole and at least one south pole.

The rotation detector 10 can have a first terminal 14 coupled to a power supply denoted as Vcc. The rotation detector 10 can also have a second terminal 16 coupled to a fixed voltage source, for example, a ground voltage source, denoted as GND. Thus, in some arrangements, the rotation detector 10 is a two terminal device (or two wire device), for which an output signal appears as a signal current at the first terminal 14, superimposed upon the low signal sensor current draw from the power supply voltage, Vcc. However, in other arrangements, one of ordinary skill in the art will understand that a rotation detector similar to the rotation detector 10 can be a three terminal device (three wire device) that has a third terminal (shown at dotted line 62) at which an output signal can appear as a voltage rather than a current.

The rotation detector 10 can include first, second, and third magnetic field sensing elements 18, 20, 22, respectively, here shown to be Hall effect elements. The first Hall effect element 18 generates a first differential voltage signal 24a, 24b, the second Hall effect element 20 generates a second differential voltage signal 26a, 26b, and the third Hall effect element 22 generates a third differential voltage signal 28a, 28b, each having respective AC signal components in response to the rotating gear 12.

While each one of the Hall effect elements 18, 20, 22 is shown to be a two terminal device, one of ordinary skill in the art will understand that each one of the Hall effect elements 18, 20, 22 is actually a four terminal device and the other two terminals of the Hall effect elements can be coupled to receive and pass respective currents as might be provided, for example, by a current source or by a voltage source (not shown).

The first differential voltage signal 24a, 24b can be received by a first differential preamplifier 30a, the second differential voltage signal 26a, 26b can be received by a second differential preamplifier 30b, and the third differential voltage signal 28a, 28b can be received by a third differential preamplifier 30c.

First and second amplified signals 32a, 32b generated by the first and second differential preamplifiers 30a, 30b, respectively, are received by a "right" channel amplifier 34a and the second amplified signal 32b and a third amplified signal 32c generated by the second and third differential preamplifiers 30b, 30c, respectively, are received by a "left" channel amplifier 34b. Designations of "right" and "left" are arbitrary.

A signal 38a generated by the right channel amplifier 34a is received by a right channel detector circuit 36a and a signal 38b generated by the left channel amplifier 34b is received by a left channel detector circuit 36b. The signals 38a, 38b can be analog signals, generally sinusoidal in nature.

Taking the right channel detector circuit 36a as representative of both of the detector circuits 36a, 36b, the right channel detector circuit 36a includes a threshold detector circuit 40a coupled to receive the signal 38a. The threshold detector circuit 40a is configured to detect positive and negative peaks of the signal 38a, to identify a peak-to-peak value of the signal 38a, and to generate the threshold signal 42a that, for example, takes on a first threshold at forty percent of the peak-to-peak value of the signal 38a and a second threshold value at sixty percent of the peak-to-peak value of the signal 38a. A comparator 44a is coupled to receive the threshold signal 42a and is also coupled to receive the signal 38a. As a result, the comparator 44a generates a binary, two-state, signal 46a that has transitions when the signal 38a crosses both the first and second thresholds.

A signal 46b generated by the left channel detector circuit 36b is generated in the same way as the signal 46a. However, since the magnetic field sensing elements 18, 20 contribute to the signal 46a, while the magnetic field sensing elements 20, 22 contribute to the signal 46b, it should be appreciated that the signals 46a, 46b have edges that differ in time (which is equivalent to phase for a particular signal frequency, i.e., particular rotation speed).

Furthermore, it should be appreciated that a direction of rotation of the gear 12 may be determined from a relative phase or relative time difference (e.g., lag or lead) of a particular edge transition in the signal 46a compared with a particular corresponding edge transition in the signal 46b. Therefore, a relative lag or a lead of edges of the signals 46a, 46b can be used to identify a direction of rotation of the gear 12.

The rotation detector 10 can include an output protocol module 48 coupled to receive and process the signals 46a, 46b and configured to generate an output signal 52, for example, as a current signal, which is indicative of the speed of rotation and the direction of rotation of the gear 12.

Movement speed of the gear 12 can be detected by the output protocol module 48 in accordance with a frequency of the signals 38a, 38b or 46a, 46b. Direction of movement of the gear 12 can be detected in accordance with a relative phase (i.e., sign of a phase) between the signals 38a, 38b or 46a, 46b.

While the rotation detector 10 is shown to include the two detector circuits 36a, 36b, each having a particular topology, it should be understood that any form of peak-referenced detectors (peak detectors) or peak-to-peak percentage detectors (threshold detectors), including, but not limited to, the above-described peak detectors and threshold percentage detectors, can be used in place of or in addition to the detector circuits 36a, 36b.

The output protocol module 48 can be operable to generate output signal formats described in conjunction with figures below.

In some embodiments, the right and left detector circuits 36a, 36b are omitted and the signals 38a, 38b are converted to digital signals and communicated directly to the output protocol module 48.

Figure 1A:
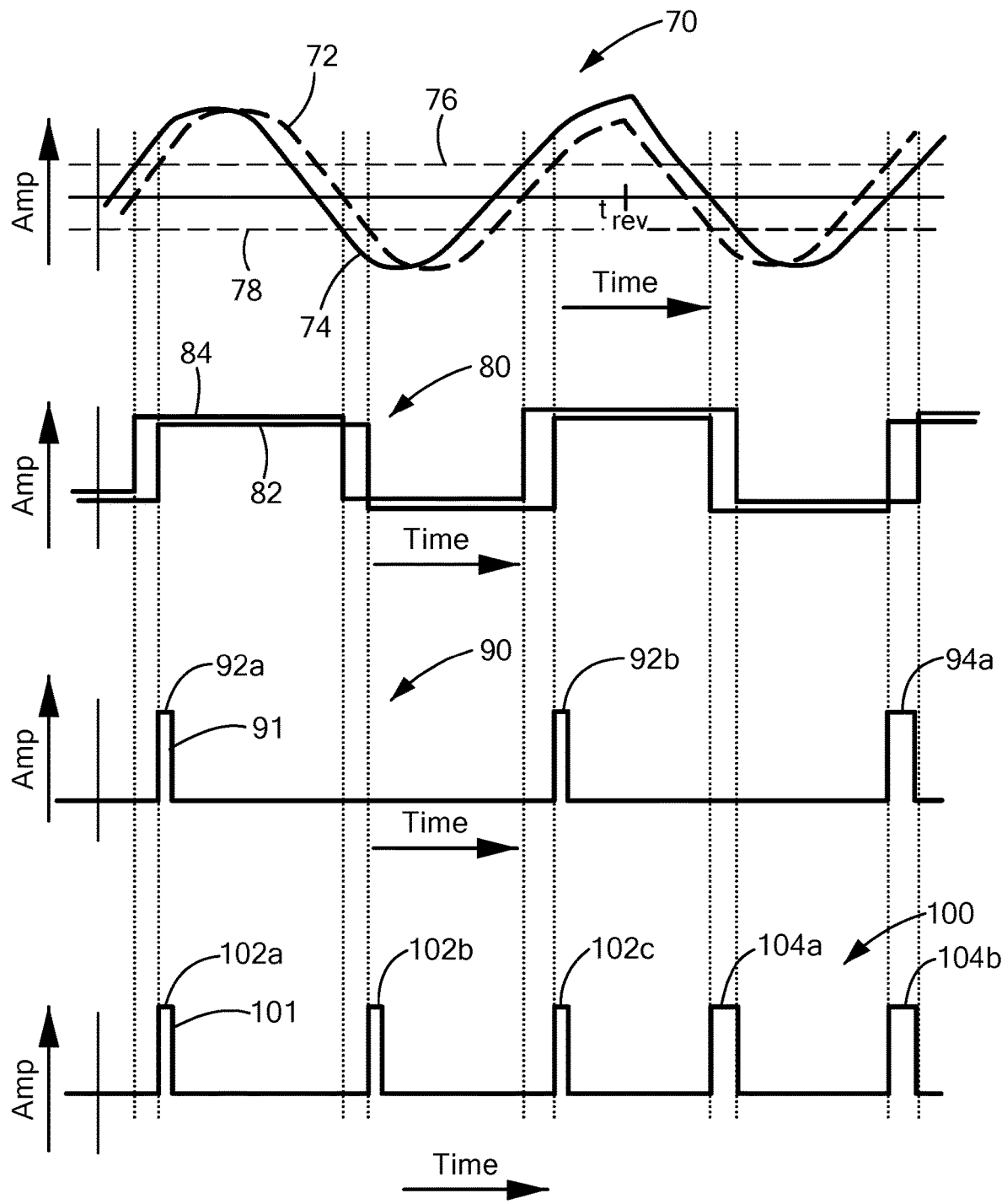
FIG. 1A is a set of graphs showing magnetic field signals, intermediate signals, and speed pulses, which can be signals from the magnetic field sensor of FIG. 1.

Referring now to FIG. 1A, graphs 70, 80, 90, 100 have the same horizontal axes with scales in units of time in arbitrary units and vertical axes with scales in units of amplitude in arbitrary units. In the graph 70, signals 72, 74 are indicative of signals 38b, 38c of FIG. 1. Threshold 76 is indicative, for example, of sixty percent of a peak-to-peak value of either one of the signals 72, 74, and threshold 78 is indicative, for example, of forty percent of a peak-to-peak value of either one of the signals 72, 74.

The thresholds 76, 78 can be generated, for example, by one of (or both of) the threshold detectors 40a, 40b. Two thresholds 76, 78 are shown for clarity. However, in some embodiments, each one of the threshold detectors 40a, 40b can generate two respective thresholds, in which case, there can be four thresholds, two thresholds applied to one of the signals 38a and the other two applied to the other signal 38b of FIG. 1.

Shapes of the signals 72, 74 indicate a change of rotation direction of the gear 12 of FIG. 1 at a time trey. Before the time trey, the signal 74 leads the signal 72 in phase. After the time trey, the signal 72 leads the signal 74 in phase.

In the graph 80, signals 82, 84 are examples of signals 46a, 46b of FIG. 1. The signals 82, 84 can be two state signals having transitions with the signals 72, 74 cross thresholds 76, 78. Before the time trey, the signal 84 leads the signal 82 in phase. After the time trey, the signal 82 leads the signal 44 in phase. Thus, a sign of relative phase of the two signals 82, 84, can be used, for example, by the output protocol module 48 of FIG. 1, to identify the direction of rotation of the ferromagnetic gear 12 (or ring magnet 60) of FIG. 1.

In other embodiments, for example, an embodiment like the magnetic field sensor 10 of FIG. 1 but with only one magnetic field sensing element and one circuit channel instead of two, there can be only one sinusoidal signal, e.g., 72, and only one two-state signal, e.g., 82. In this case, there may be no provision to identify direction of rotation of the ferromagnetic gear 12 (or ring magnet 60).

In the graph 90, a signal 91 can be comprised of pulses 92a, 92b, and 94a, an example of a serial signal that can be the same as or similar to the signal 52 of FIG. 1. In time, the pulses 92a, 92b, and 94a can occur proximate to a time of positive or negative transitions of one of the signals 82, 84. Thus, the pulses 92a, 92b, 94a occur at each full cycle of the signals 72, 74.

A rate of the pulses 92a, 92b, and 94a can be indicative of a speed of rotation of the ferromagnetic object 12 (or ring magnet 60). Time periods, e.g., respective pulse widths, of the pulses 92a, 92b, and 94a can be indicative of a direction of rotation of the ferromagnetic gear (or ring magnet 60). Thus, before the time trey, the pulses 92a, 92b can be shorter, e.g., forty-five microseconds, and after the time trey, the pulses 94a can be longer, e.g., ninety microseconds.

As used herein, the pulses 92a, 92b, 94a are referred to as "speed pulses" because a rate of the pulse 92a, 92b, 94a is indicative of at least the speed of rotation (with or without direction information) of the ferromagnetic object 12 (or ring gear 60) of FIG. 1.

In the graph 100, a signal 101 can be comprised of pulses 102a, 102b, 102c, 104a, and 104b, an example of a serial signal that can be the same as or similar to the signal 52 of FIG. 1. In time, the pulses 102a, 102b, 102c, 104a, and 104b can occur proximate to a time of both positive and negative transitions of one of the signals 82, 84. Thus, the pulses 102a, 102b, 102c, 104a, and 104b occur at each half cycle of the signals 72, 74.

A rate of the pulses 102a, 102b, 102c, 104a, and 104b can be indicative of the speed of rotation of the ferromagnetic object 12 (or ring magnet 60). A time period, e.g., respective pulse widths, of the pulses 102a, 102b, 102c, 104a, and 104b can be indicative of a direction of rotation of the ferromagnetic gear (or ring magnet 60). Thus, before the time trey, the pulses 102a, 102b, 102c can be shorter, e.g., forty-five microseconds, and after the time trey, the pulses 104a, 104b can be longer, e.g., ninety microseconds.

It should be apparent that a rate of the pulses 102a, 102b, 102c, 104a, 104b is twice the rate of the pulses 92a, 92b, 94a.

Embodiments are shown below for which speed pulses are like the speed pulses 92a, 92b, 94a, where one speed pulse occurs on each cycle of the signals 72, 74. However, in other embodiments, like the speed pulses 102a, 102b, 102c, 104a, 104b, two speed pulses can occur in each cycle of the signals 72, 74.

As the speed of rotation of the object increases and the frequency of the magnetic field signal increases, it may become difficult to differentiate between output pulses for the output signal. For example, as the speed increases, the frequency of pulses likewise increases, and this can cause errors in determining the speed and/or direction of rotation of an object. In accordance with the present disclosure, two or more ranges of speed information can be implemented to convey speed in an output signal, for example having a low-speed range where an output pulse is given for every detector signal transition, and a high-speed range where an output pulse is given every other detector signal transition or every fourth transition. In the first low-speed range, the output signal can have a first format and a second format. The first format outputs a first set number of pulses for each feature of the target and the second format comprises a second set number of pulses for each feature of the target, different to the number of pulses for each target feature in the first format. As such, data about high input signal frequencies can be transmitted without having to truncate output information and while avoiding output pulse overlap. This disclosure further allows for the range (e.g., low-speed or high-speed) to be communicated as part of the output.

Note that according to the disclosure, the number of output pulses need not be one to one related to detector signal transitions. As such, there is no limit to the maximum frequency of which the input signal can be sensed in accordance with the techniques of the present disclosure. Magnetic speed and/or direction sensors typically implement an output protocol where there is a single fixed correlation between the number output pulses and the input magnetic field signal, irrespective of the frequency with which the input signal changes. In some protocols, one output message comprises multiple pulses, encoding additional information. In such protocols, the correlation between the output message length and the frequency of the input signal determines the maximum frequency of the input signal which can be sensed without truncation. This can disadvantageously cause data with high spatial resolution at low frequencies to limit the maximum operating frequency. By defining multiple ranges according to the present disclosure (i.e., by permitting more than one fixed correlation between the number of output pulses and the input magnetic field signal based on the frequency with which the input signal changes, or the target speed), this limitation can be overcome according to the techniques of the present disclosure.

More generally, the present disclosure is configured to generate an output signal having a first format (e.g., a first number of pulses or transitions) when a characteristic of the magnetic field signal (e.g., a frequency) is within a first range, which magnetic field signal frequency corresponds to a speed of motion of the target. The output signal can further have a second, different format (e.g., a second number of pulses or transitions) when the characteristic of the magnetic field signal is within a second range different than the first range.

Figure 2:
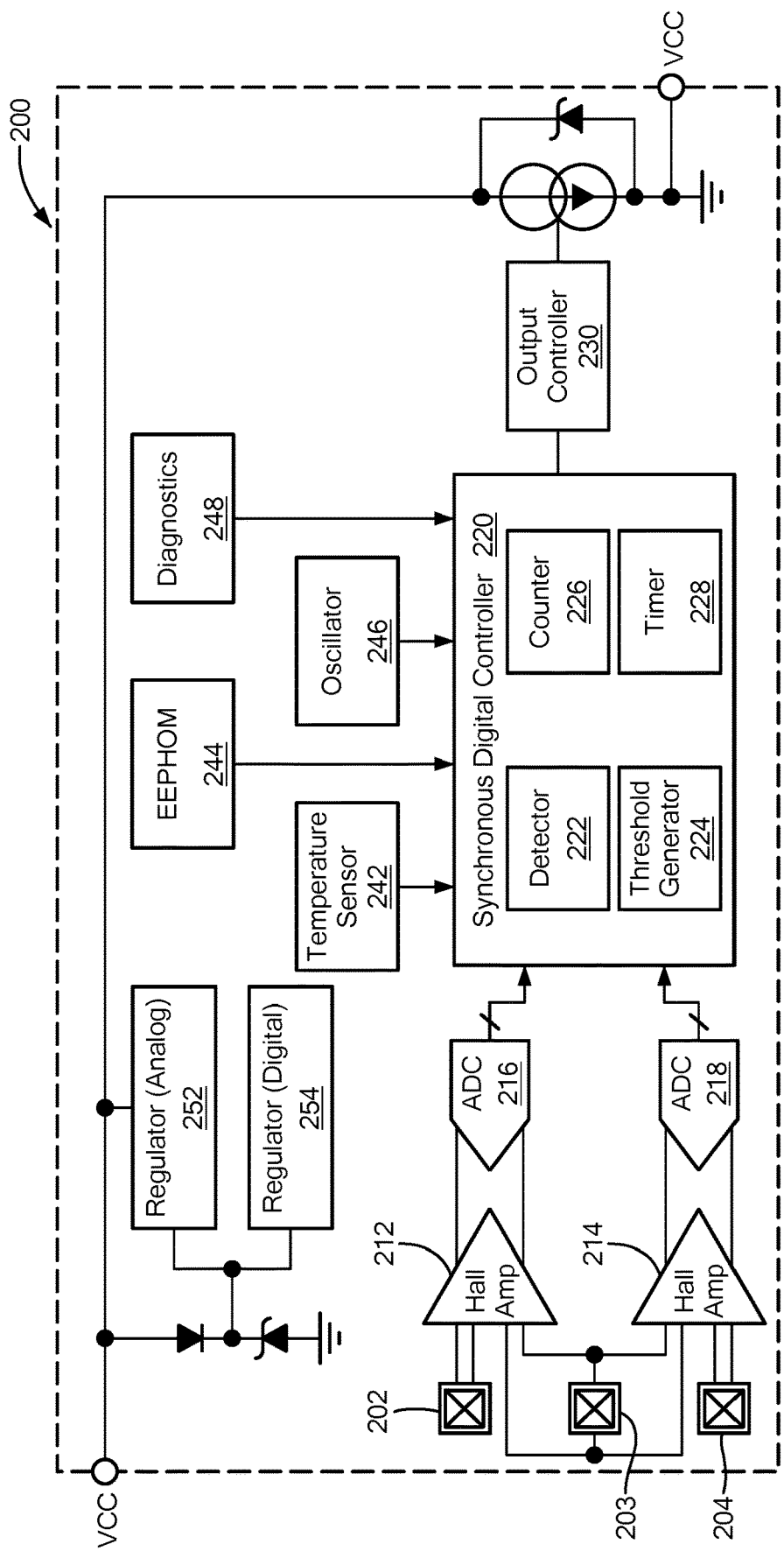
FIG. 2 is a block diagram of a magnetic field sensor in a digital implementation, according to the present disclosure.

FIG. 2 is a block diagram of the magnetic field sensor 200 in a digital implementation, according to the present disclosure to implement two or more ranges of speed information for the output signal. Although FIG. 2 shows a primarily digital implementation, it will be appreciated that the techniques may likewise be applied to analog signals and circuits for analog signals. The magnetic field sensor 200 can be the same as, or similar to, the magnetic field sensor 10 in FIG. 1. The magnetic field sensor 200 includes magnetic field sensing elements 202, 203, 204, which may be the same as magnetic field sensing elements 18, 20, 22 in FIG. 1. The magnetic field sensing elements 202, 203, 204 are coupled to amplifiers 212, 214. Amplifiers 212, 214 can receive a differential magnetic field signal from the magnetic field sensing elements 202, 203, 204. Specifically, amplifier 212 can receive a signal from magnetic field sensing elements 202 and 203, and amplifier 214 can receive a signal from magnetic field sensing elements 203 and 204. Each amplifier 212 and 214 is coupled to an analog-to-digital converter (ADC) 216 and 218, respectively, to convert the analog signal into digital domain. The amplifier 212 can be the same as, or substantially similar to, the right channel amplifier 34a shown in FIG. 1, and the amplifier 214 can be the same as, or substantially similar to, the left channel amplifier 34b shown in FIG. 1. Although three Hall elements 202, 203, 204 are shown, one may be omitted and the circuit could operate with only two Hall elements, each providing a signal to their respective amplifier to determine speed of rotation of the object.

Each digital magnetic field signal is received by a synchronous digital controller 220. The synchronous digital controller 220 can include a detector 222 which may be the same as, or substantially similar to, the right detector circuit 36a and/or the left detector circuit 36b. The synchronous digital controller 220 also includes a threshold generator 224, a counter 226, and a timer 228, as described in greater detail herein. The detector 222 is responsive to the magnetic field signal(s) generated by the magnetic field sensing element(s) 202, 203, 204, and is responsive to a threshold signal generated by the threshold generator 224. The detector 222 generates a detector signal having edges occurring in response to a comparison of the magnetic field signal and the threshold signal and occurring at a rate corresponding to a speed of motion of the object. The threshold generator 224 is used to generate the threshold signal to which the magnetic field signal is compared.

Figure 6:
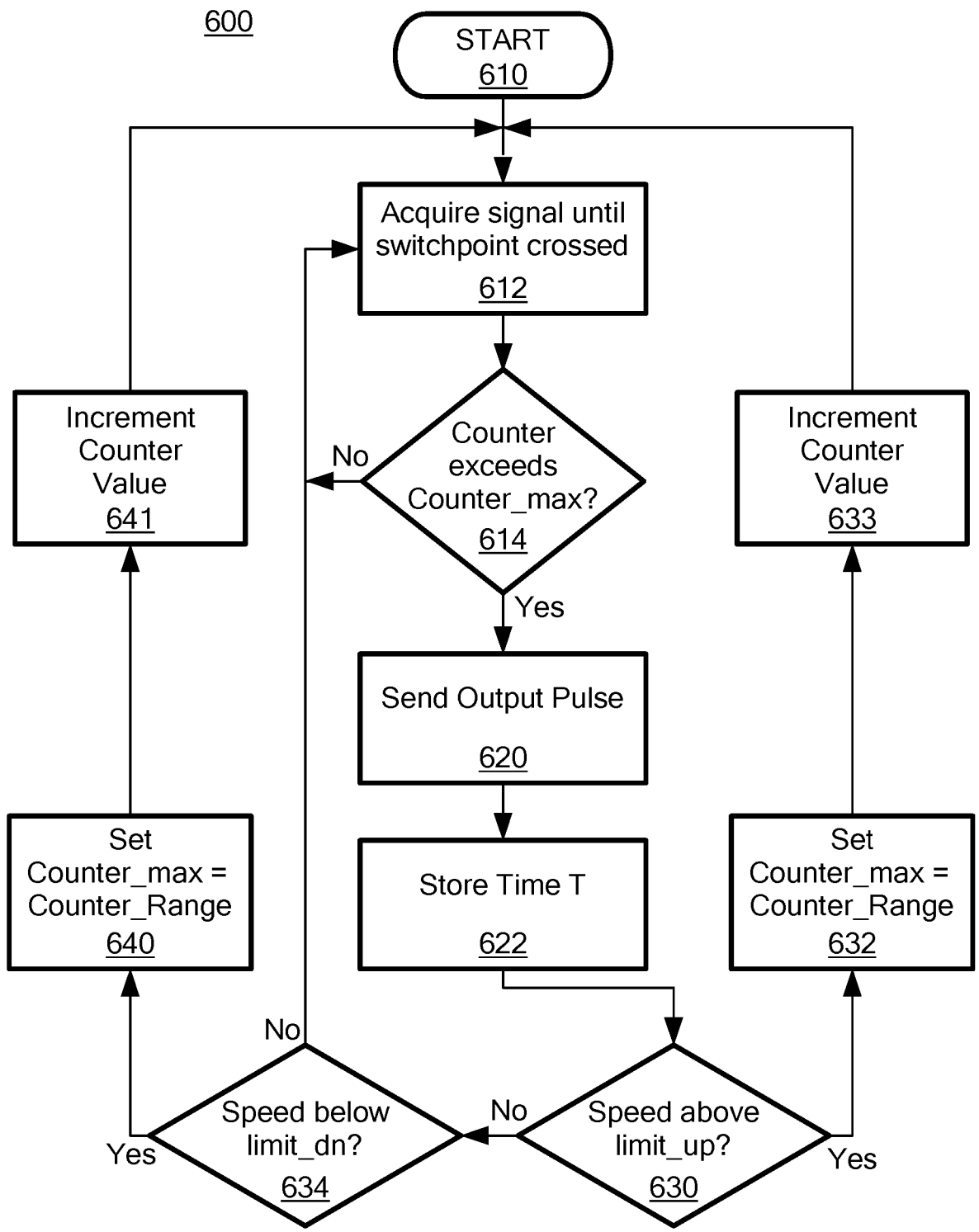
FIG. 6 is a flow chart showing a process of generating an output signal indicative of a speed and/or a direction of rotation of an object.

The counter 226 is used to determine the speed of the motion of the object, and its operation is described in greater detail with relation to FIG. 6. The counter 226 can be set to a predetermined value and incremented in response to transitions of the detector signal. As such, once the counter 226 reaches a certain value, an output pulse is generated. As such, if it is desired to output a pulse only every other time a transition of the detector signal occurs for example, then the counter can be set to two and thus every two edges of the detector signal results in a single output pulse. The limit for the counter 226 can be varied, for example, depending on the operating frequency of the incoming magnetic field signals. For example, the value of the counter 226 could change as the operating frequency changes such that at a first low frequency, the counter could be set to one, at a second mid frequency the counter could be set to two, and at a third high frequency the counter could be set to three. The value for the counter could also be preset or programmable, such as by a user.

The timer 228 is used to determine an amount of time between output pulses as described in greater detail herein regarding FIG. 6.

The synchronous digital controller 220 is coupled to an output controller 230, which may be the same as, or substantially similar to, the output protocol circuit 48 of FIG. 1. The synchronous digital controller 220 can also be coupled to a temperature sensor 242, a memory (e.g., EEPROM) 244, an oscillator 246, and a diagnostics circuit 248 to perform diagnostics on the magnetic field sensor 200. There may also be included a voltage regulator 252 (analog) and a voltage regulator 254 (digital) which may be the same as, or substantially similar to, the regulator 54 of FIG. 1.

According to the disclosure, the controller 230 is coupled to receive the detector signal and configured to generate an output signal having a first format when a characteristic (e.g., frequency) of the magnetic field signal is within a first range and having a second format different than the first format when the characteristic of the magnetic field signal is within a second range, different than the first range. The first output signal format can include a set amount of pulses for each feature of the object and the second output signal format can include a second set amount of pulses for each feature of the object, different than the amount of pulses for each target feature in the first output signal format. The first range can correspond to a low magnetic field signal frequency range and the second range can correspond to a high magnetic field signal frequency range.

The output circuit 230 can be configured to provide an indication of the range of the magnetic field characteristic. A transition of the output signal between the first format and the second format may be delayed until after the indication of the range of the magnetic field signal characteristic is provided. The output signal can include the indication of the range of the magnetic field signal characteristic. The output signal can include a plurality of pulses, and the indication of the range of the magnetic field signal characteristic can be provided by the pulse width (see, e.g., FIG. 8), the pulse height (see, e.g., FIG. 9), or a time between a falling edge of the first pulse and a rising edge of the second pulse (see, e.g., FIG. 10). The indication of range can be provided as a separate second output signal that provides the indication of range, and a first output signal can provide the speed information (see, e.g., FIGS. 7 and 11-12).

Figure 3:
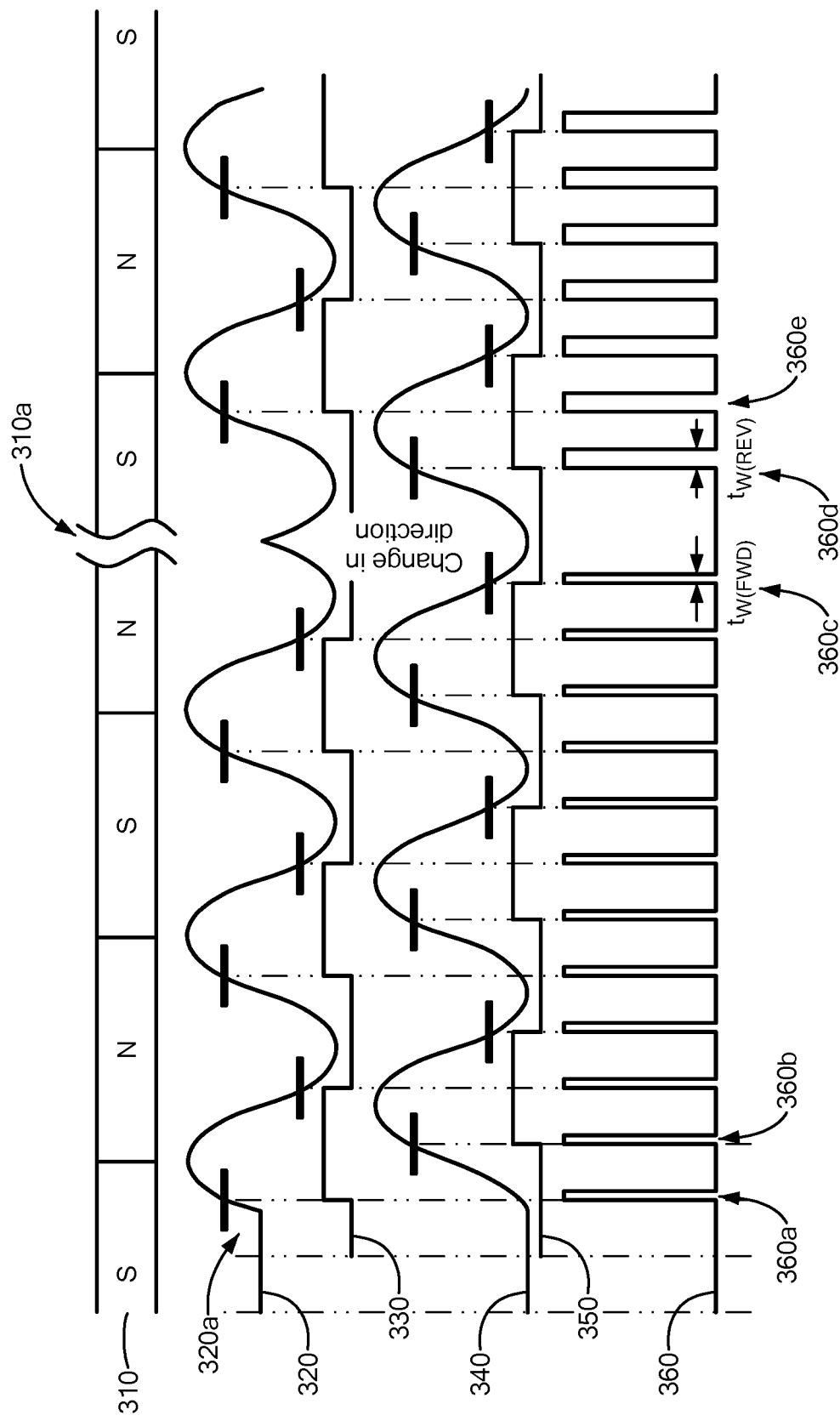
FIG. 3 is a set of graphs showing magnetic field signals, an example of corresponding detector signals, and a corresponding output signal indicative of a speed and a direction of rotation of an object.

FIG. 3 is a set of graphs showing magnetic field signals 320, 340, an example of corresponding detector signals 330, 350, and a corresponding sensor output signal 360 indicative of speed and direction of rotation of an object. The magnetic field signals 320, 340 can be generated by the sensor 10 (FIG. 1) or the sensor 200 (FIG. 2). The profile of the ring magnet 310 is shown in the graph 300 as including poles labeled S or N, representative of "south" and "north" poles of the ring magnet and can also be first and second opposing poles. Note that there is a change in direction at 310a, indicated by the break in the ring magnet polarity 310 of the object. Also note that the object begins rotating at point 320a, at which time magnetic field signals commence being generated. A first (e.g., "right") channel magnetic field signal 320 is shown, as well as the corresponding detector signal 330. Detector signal 330 can correspond to an output of the detector 222 comparing the magnetic field signal (e.g., 320) received from the amplifier 212 and ADC 216. A second (e.g., "left") channel magnetic field signal 340 is shown, as well as the corresponding detector signal 350. Detector signal 350 can correspond to an output of the detector 222 comparing the magnetic field signal (e.g., 340) received from the amplifier 214 and ADC 218.

The sensor output signal 360 includes a plurality of pulses occurring at a frequency indicative of the speed of motion of the object. As shown, there is an output pulse 360a, 360b coinciding with each transition of the detector signals 330, 350, with each pulse of the output signal 360 having a predetermined width.

Note that after output pulse 360c, the direction of motion of the object changes. Note that the pulses 360d, 360e have a width that is greater than a width of the pulses 360a, 360b, 360c. The width of the pulses can be used to convey the direction of rotation of the object, such that the smaller pulse width indicates rotation in a first direction, and the larger pulse width indicates rotation in a second direction opposite the first direction. In some embodiments, the width of the pulse may be used to provide a different indication such as the range of speed of the output signal, and another technique or output signal can be used to convey direction of rotation.

It will be appreciated that, as the magnetic field signal increases in frequency, the number of transitions (of the detector) in a given period of time will likewise increase, and the output pulses can become so close together that they can overlap and/or become indistinguishable. Or, in the case of multiple magnetic field signals, there can be multiple transitions that occur rapidly, which can also render output pulses overlapping and/or indistinguishable.

In accordance with the present disclosure, multiple speed ranges are defined, and depending on the current speed range, only every $n^{th}$ output pulse is actually transmitted on the sensor output where "n" correlates to the counter disclosed herein used to determine the number of pulses that are output for each detector signal transition. Additionally, information about the current speed range can be provided as part of the output protocol to allow the correct speed calculation by the controller. This allows for data with high spatial resolution to be transmitted in a predefined speed range, typically at low speeds, while still allowing transmission of data with lower spatial resolution at higher speeds. For example, a high-resolution wheel speed sensor can require more than 1 pulse per target pole-pair at low speeds, for example for vehicle parking conditions, while at the same time capable of performing measurements at maximum vehicle speed. As such, the output circuit receives the detector signal and generates an output signal having a first format when a characteristic of the magnetic field signal is within a first range and having a second format different than the first format when the characteristic of the magnetic field signal is within a second range, different than the first range. The characteristic of the magnetic field signal can be a frequency of the magnetic field signal.

Figure 4:
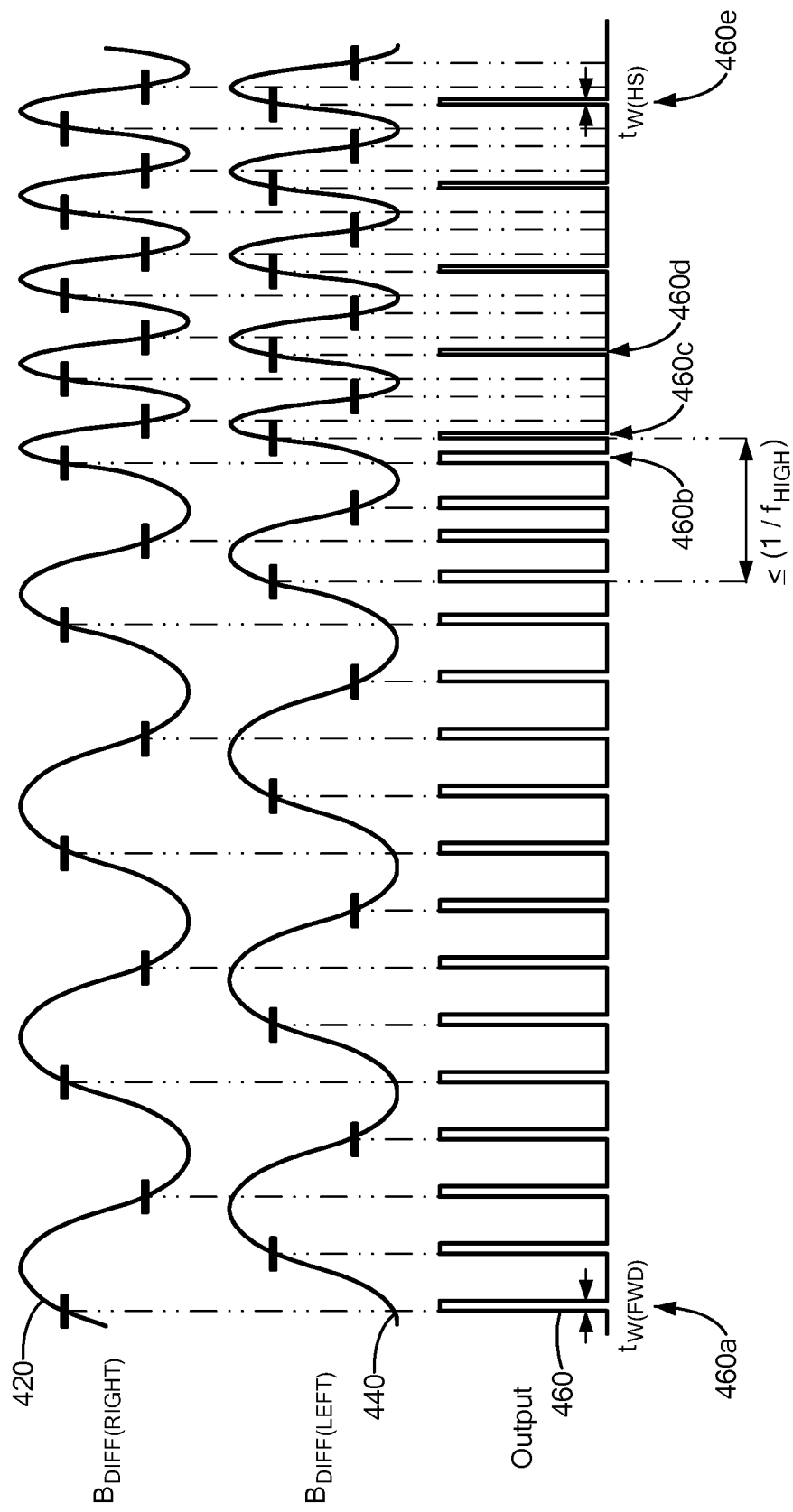
FIG. 4 is a set of graphs showing magnetic field signals and a corresponding output signal indicative of a speed and a direction of rotation of an object, where the speed of rotation of the object increases.

FIG. 4 is a set of graphs showing magnetic field signals 420, 440, and a corresponding sensor output signal 460 indicative of speed (and optionally also direction) of rotation of an object, where the object movement increases from a low speed to a higher speed. The first ("right") magnetic field signal 420 is shown, as well as the second ("left") magnetic field signal 440. The first magnetic field signal 420 can correspond to the differential signal received at the ADC 216 for the first (right) channel and the second magnetic field signal 440 can correspond to the differential signal received at the ADC 218 for the second (left) channel. The signals 420, 440 can be generated by sensor 10 (FIG. 1) or by sensor 200 (FIG. 2).

The output signal 460 is also shown, which includes a plurality of output pulses, including pulses 460a, 460b, 460c, 460d, and 460e, where the pulse width is used to provide the indication of range of speed. Pulses 460a-460b represent a first ("low-speed") range of speed for the object, and pulses 460c-460e represent a second ("high-speed") range of speed for the object. In this example, the object transitions from low-speed range to high-speed range at pulse 460c. Note that the first (low-speed) range has a first pulse width and the second (high speed) range has a second pulse width different than the first pulse width. To also convey direction information, there can be a total of, for example, four different pulse widths provided, with a first pulse width indicating a first direction in the low-speed range, a second pulse width indicating a second opposing direction in the low-speed range, a third pulse width indicating the first direction in the high speed range and a fourth pulse width indicating the second direction in the high speed range. Accordingly, the pulse width can convey both direction of rotation and the range of speed of rotation of the object.

It will be appreciated that while many of the figures herein show two magnetic field signals (e.g., 420, 450), generating an output signal having a first format when a characteristic of the magnetic field signal is within a first range and having a second format different than the first format when the characteristic of the magnetic field signal is within a second range, different than the first range according to the disclosure can be implemented with a single magnetic field signal. Two magnetic field signals are shown to illustrate that in embodiments in which direction is indicated by the sensor output signal (in addition to speed), it is necessary to generate two phase separated magnetic field signals in order to be able to detect direction.

Figure 5:
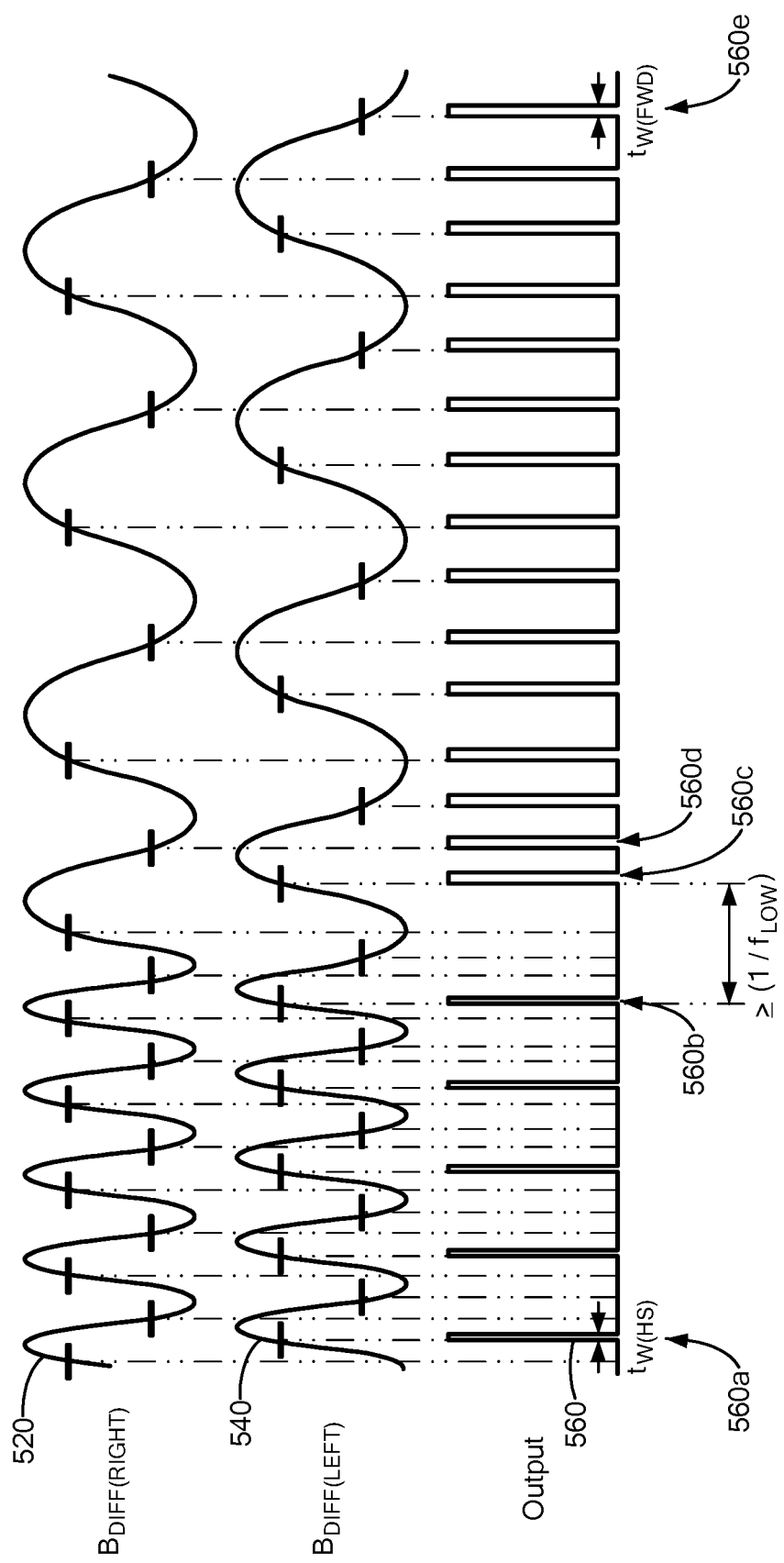
FIG. 5 is a set of graphs showing magnetic field signals and a corresponding output signal indicative of a speed and a direction of rotation of an object, where the speed of rotation of the object decreases.

FIG. 5 is a set of graphs showing magnetic field signals 520, 540, and a corresponding sensor output signal 560 indicative of a speed (and optionally also direction) of rotation of an object, where the object movement decreases from a high speed to a lower speed. The first ("right") magnetic field signal 520 is shown, as well as the second ("left") magnetic field signal 540. The first magnetic field signal 520 can correspond to the signal received at the ADC 216 for the first (right) channel and the second magnetic field signal 540 can correspond to the signal received at the ADC 218 for the second (left) channel. The signals 520, 540 can be generated by sensor 10 (FIG. 1) or sensor 200 (FIG. 2).

The output signal 560 is also shown, which includes a plurality of output pulses, including pulses 560*a*, 560*b*, 560*c*, 560*d*, and 560*e*, where the pulse width is used to represent the indication of the range of speed. Pulses 560*a*-560*b* represent a second ("high-speed") range of speed for the object, and pulses 560*c*-560*e* represent a first ("low-speed") range of speed for the object. In this example, the object transitions from the high-speed range to the low-speed range at pulse 560*c*. Note that, similar to the graphs of FIG. 4, the second (high-speed) range pulses 560*a*, 560*b* have a second pulse width and the first (low-speed) range pulses 560*c*, 560*d*, 560*e* have a first pulse width different than the second pulse width. To also convey direction information, there can be a total of, for example, four pulse widths provided, with a first pulse width indicating a first direction in the low-speed range, a second pulse width indicating a second direction in the low-speed range, a third pulse width indicating the first direction in the high speed range and a fourth pulse width indicating the second direction in the high speed range. Accordingly, the pulse width can convey both direction of rotation and the range of speed of rotation of the object.

FIG. 6 is a flow chart showing a process of generating an output signal indicative of a speed of rotation of an object. The process starts at block 610 and continues to block 612 to acquire the signal until a switch point is crossed (where a detector signal transition occurs). When a switch point is crossed, the process advances to block 614, where it is determined if the counter exceeds the value of Counter_max. The counter is used to count n switch point crossings where the sensor output signal contains only an output pulse for every $n^{th}$ switch point crossing. The counter at block 614 is set once the speed-range changes. The counter value can be varied depending upon a particular application and the number of output pulses that are desired to be transmitted/omitted. For example, if one wishes to output every other pulse, then the counter would be set to a value of two (2), and likewise if one wishes to output every third pulse, then the counter would be set to a value of three (3). It will be appreciated that although only two different ranges are shown in FIGS. 4-5, any number of ranges can be provided, with each range having its own counter number. For example, when the object speed (i.e., magnetic field signal frequency) is in the low-speed range, the counter can be set to one (1). And then when the object speed (i.e., magnetic field signal frequency) transitions into high speed range, the counter can be set to two (2). Still further, when the sensor transitions into a third, higher speed range, the counter can be set to three (3) or another desired value, to achieve three separate speed ranges.

Each time a detector signal transition occurs, the counter is incremented and when the counter value exceeds the Counter_max value, the process advances to step 620 to send an output pulse. At block 614, if the counter does not exceed the Counter_max value, the process loops back to block 612 to continue to acquire the signal until a transition occurs. The time "T" at which the output pulse is generated is stored at block 622 for example, this can be accomplished by timer 228 in controller 220.

A change in speed range can occur once the comparison between the stored time (T) and the current time is larger or smaller than current upper-time and lower-time thresholds (blocks 630 and 634), based on the current speed range. At block 630, the process determines if the speed is above the upper time threshold, limit_up. If yes, then the Counter_max value is set to be the counter_range at block 632, the counter value is incremented at block 633, and the process returns to block 612 to continue to acquire the signal until a detector signal transition occurs. If the speed is not above the limit_up at block 630, the process continues to block 634 to determine if the speed is below the lower time threshold, limit_dn. If the speed is not below the limit_dn at block 634, then the process returns to block 620 to send an output pulse. If the speed is below the limit_dn at block 634, then the process continues to block 640. At block 640, the counter_max value is set to be the counter_range, the counter value is incremented at block 641, and the process returns to block 612 to continue to acquire the signal until a detector signal transition occurs. Note that the upper limit limit_up and the lower limit limit_dn may differ by a sufficient amount to implement hysteresis.

To generate a speed signal without interruptions or jumps, the controller should receive the information that the sensor will change the speed range at least one message ahead of the actual change. Therefore, a delay may also be required, delaying the speed range change by one message, while already communicating the change of speed range. This can, for example, be implemented by the controller 220 so that once a transition to a different frequency range is detected by the controller (e.g., from the first range to the second range), the next message delayed by one message is sent at the frequency of the first range with the format of the second range.

Figure 7:
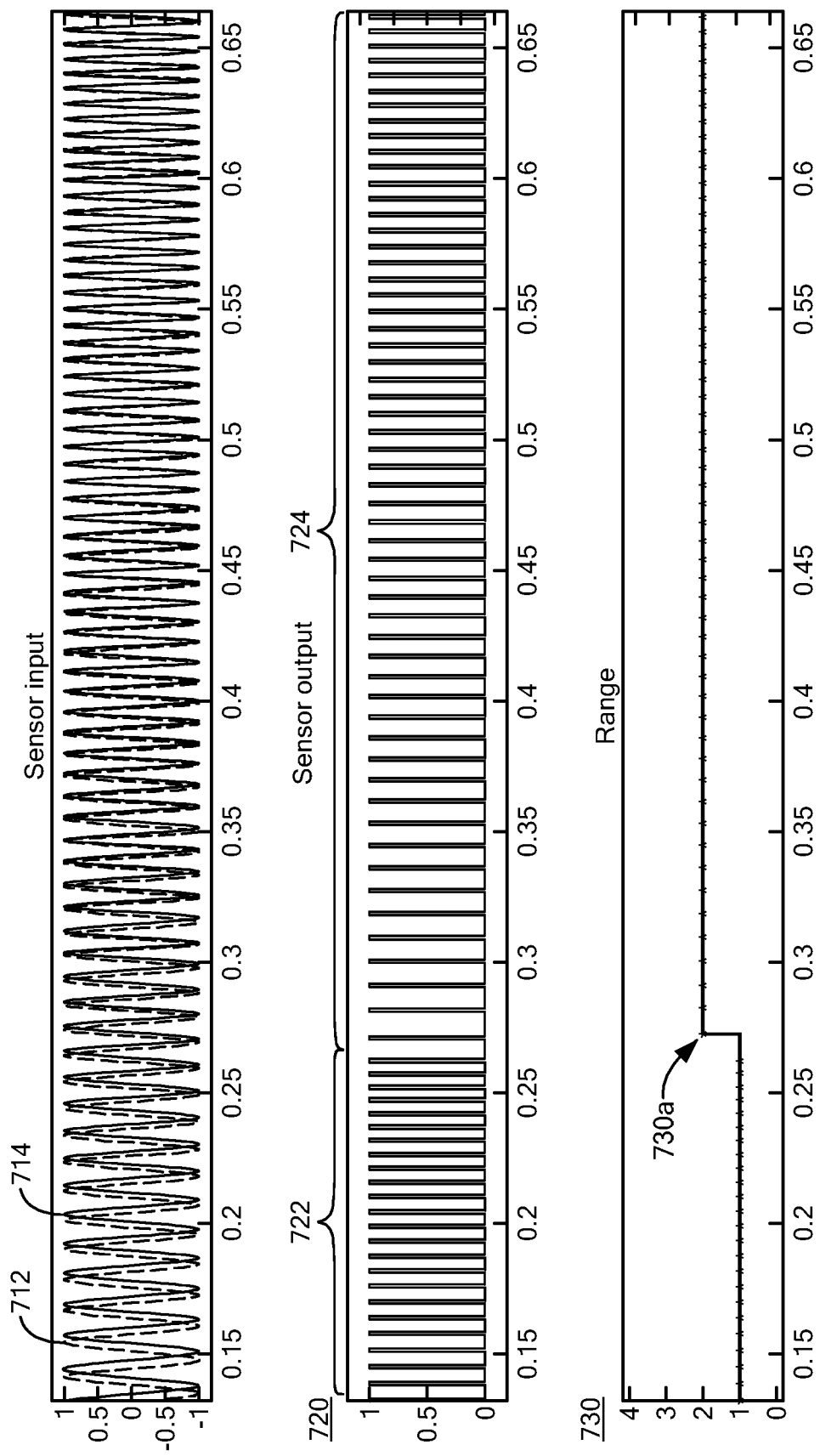
FIG. 7 is a set of graphs showing magnetic field signals, an example output signal of the magnetic field sensor including speed information, and a range of the output signal.

FIG. 7 is a set of graphs showing magnetic field signals 712, 714, an example output signal 720 of the magnetic field sensor including speed information, and an example output range signal 730. Signals 712, 714 can be generated by sensor 10 (FIG. 1) or sensor 200 (FIG. 2). Initially, one output pulse per pole-pair is generated. As the target speed increases, the output pulses could become indistinguishable if conveyed as one output pulse per pole-pair. Once the magnetic field signal frequency crosses a certain threshold (e.g., a predetermined amount of time such as 0.27 seconds between pulses) the sensor can begin to convey the output signal in a second format in which only every other pulse is conveyed (e.g., generate output pulse every two pole pairs) to ensure that distinguishable output pulses are conveyed.

Graph 720 shows the sensor output (e.g., output of sensor 10 in FIG. 1 or sensor 200 in FIG. 2). The output pulses 722 are shown in the first range and the output pulses 724 are shown in the second range. The width of the pulses 722, 724 can indicate a direction of rotation of the object.

The range of speed of the output signal needs to be communicated by the output so that the controller can, for example, determine the range of speed to determine the speed of rotation of the object. There are various ways of doing this, such as different pulse width, different pulse height, and/or different spacing between successive pulses to convey the range of speed of the output signal. For example, a single output line could be used to communicate both speed information and the range information (see, for example, FIGS. 8-10) or two output lines can be used to communicate the output, with one output line providing speed information and another output line providing range information (see, for example, FIGS. 11-12).

In this example, a separate output signal 730 is provided to indicate the range of speed of motion of the target (i.e., the range of frequency of the magnetic field signal). Note that at 730a, the signal 730 transitions to convey the second range of speed, and the output pulses transition from pulses 722 to pulses 724. In some embodiments, a second signal can be implemented to convey direction (see, e.g., FIGS. 11-12) and/or additional encoded pulses (not shown) between the output pulses shown in 720 could be used to convey information about the speed range.

Figure 8:
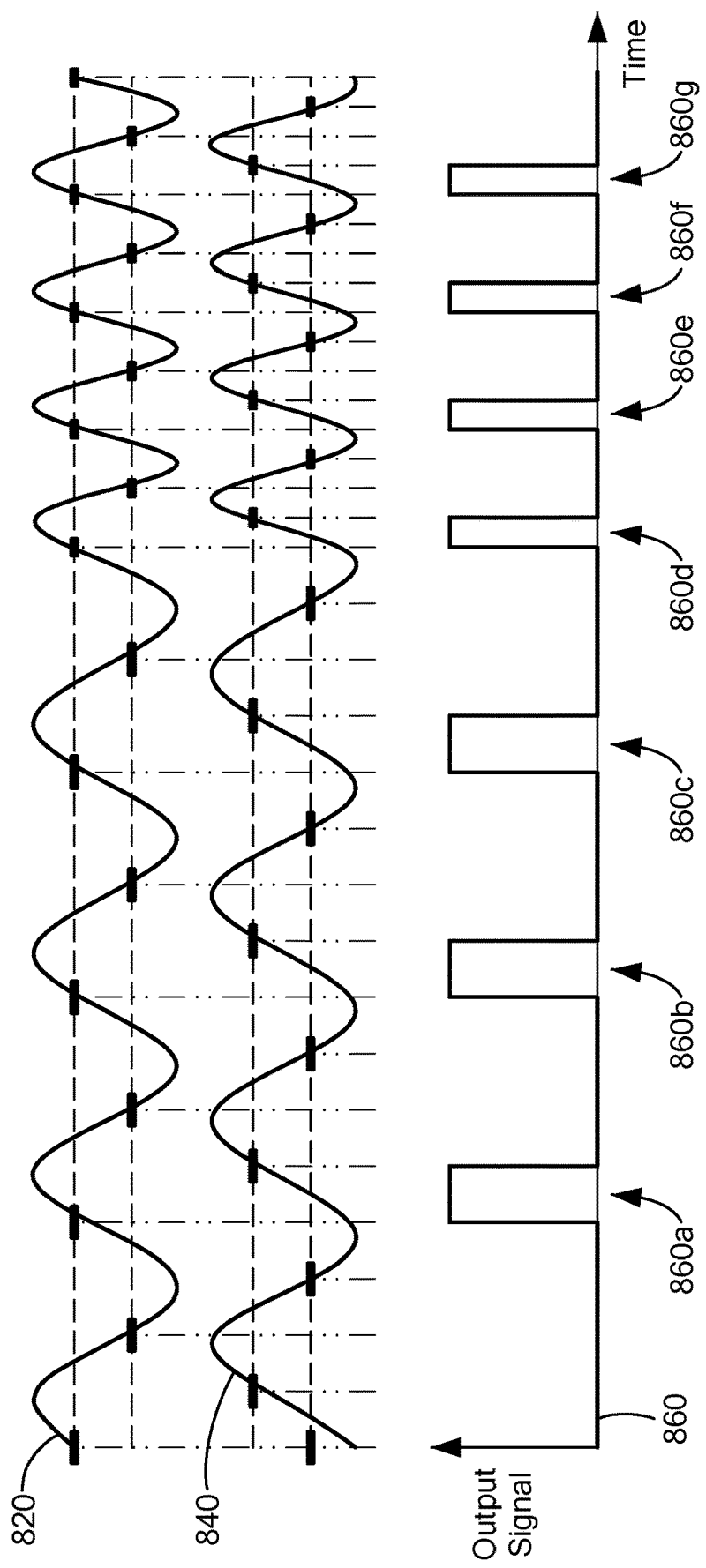
FIG. 8 is a set of graphs showing magnetic field signals and a corresponding output signal indicative of a speed and/or a direction of rotation of an object, where the pulse width of the output signal indicates a change in the range.

FIG. 8 is a set of graphs showing magnetic field signals 820, 840 and a corresponding sensor output signal 860 indicative of speed (and optionally also direction) of rotation of an object, where a change in the pulse width of the output signal indicates a change in the range. Magnetic field signals 820, 840 can be magnetic field signals generated by sensor 10 (FIG. 1) or sensor 200 (FIG. 2) and can be the same as or substantially similar to magnetic field signals 420, 440 in FIG. 4, magnetic field signals 520, 540 in FIG. 5, and magnetic field signals 712, 714 in FIG. 7. The output signal 860 comprises a plurality of pulses 860a, 860b, 860c, 860d, 860e, 860f, and 860g. As shown, pulses 860a, 860b, 860c have a first pulse width indicative of a first range (i.e., a first target speed and a first magnetic field signal frequency), and pulses 860d, 860e, 860f, 860g have a second pulse width indicative of a second range (i.e., a second faster target speed and a second higher magnetic field signal frequency). A second signal or other format or technique can be used to indicate a direction of rotation of an object (not shown).

Figure 9:
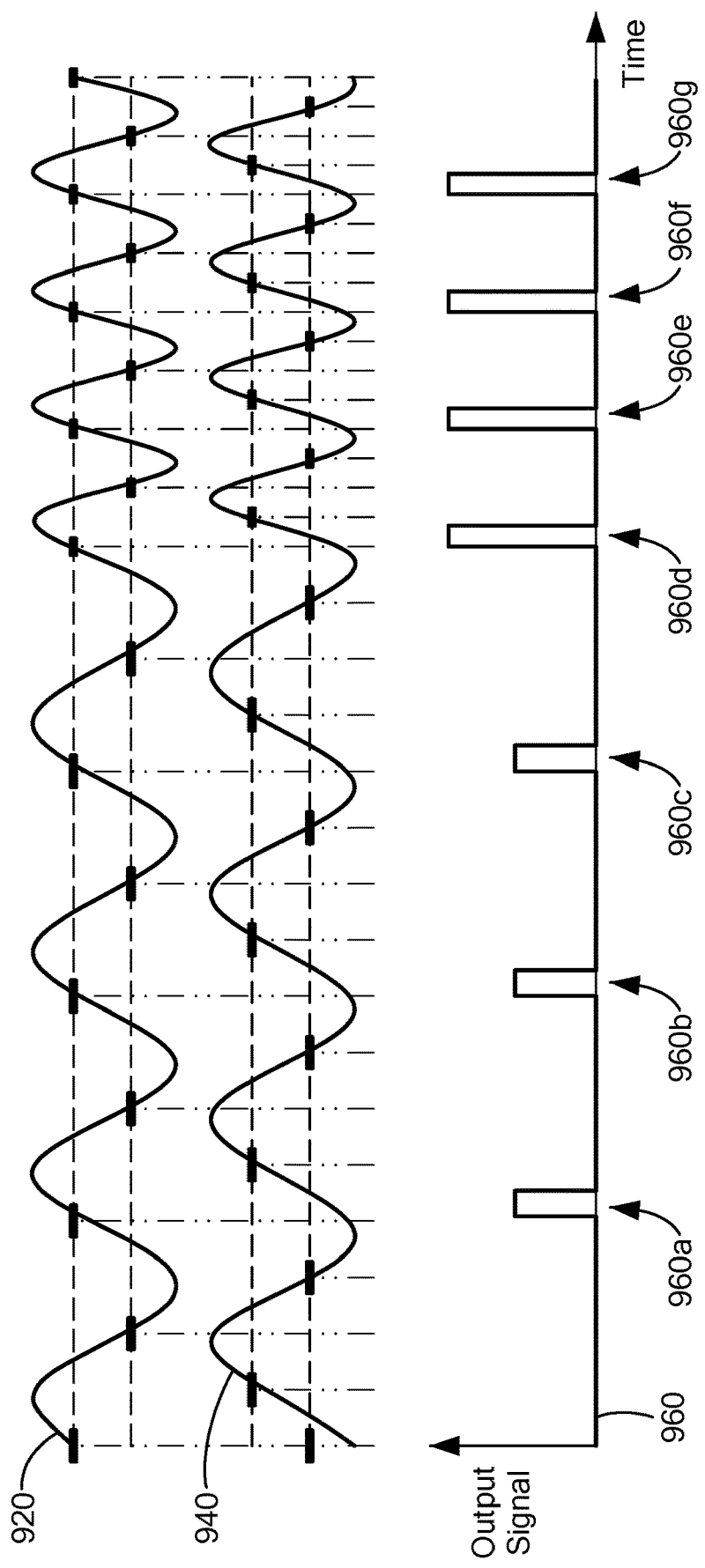
FIG. 9 is a set of graphs showing magnetic field signals and a corresponding output signal indicative of a speed and/or a direction of rotation of an object, where the pulse height of the output signal indicates a change in the range.

FIG. 9 is a set of graphs showing magnetic field signals 920, 940 and a corresponding output signal 960 indicative of speed (and optionally also direction) of rotation of an object, where the pulse height of the output signal indicates a change in the range. Magnetic field signals 920, 940 can be magnetic field signals generated by sensor 10 (FIG. 1) or sensor 200 (FIG. 2) and can be the same as or substantially similar to magnetic field signals 420, 440 in FIG. 4, magnetic field signals 520, 540 in FIG. 5, and magnetic field signals 712, 714 in FIG. 7. The output signal 960 comprises a plurality of pulses 960a, 960b, 960c, 960d, 960e, 960f, 960g. As shown, pulses 960a, 960b, 960c are a first pulse height indicative of the first (e.g., low-speed) range, and pulses 960d, 960e, 960f, 960g are a second pulse height indicative of the second (e.g., high-speed) range. A second signal or other format or technique can be used to indicate a direction of rotation of an object (not shown).

Figure 10:
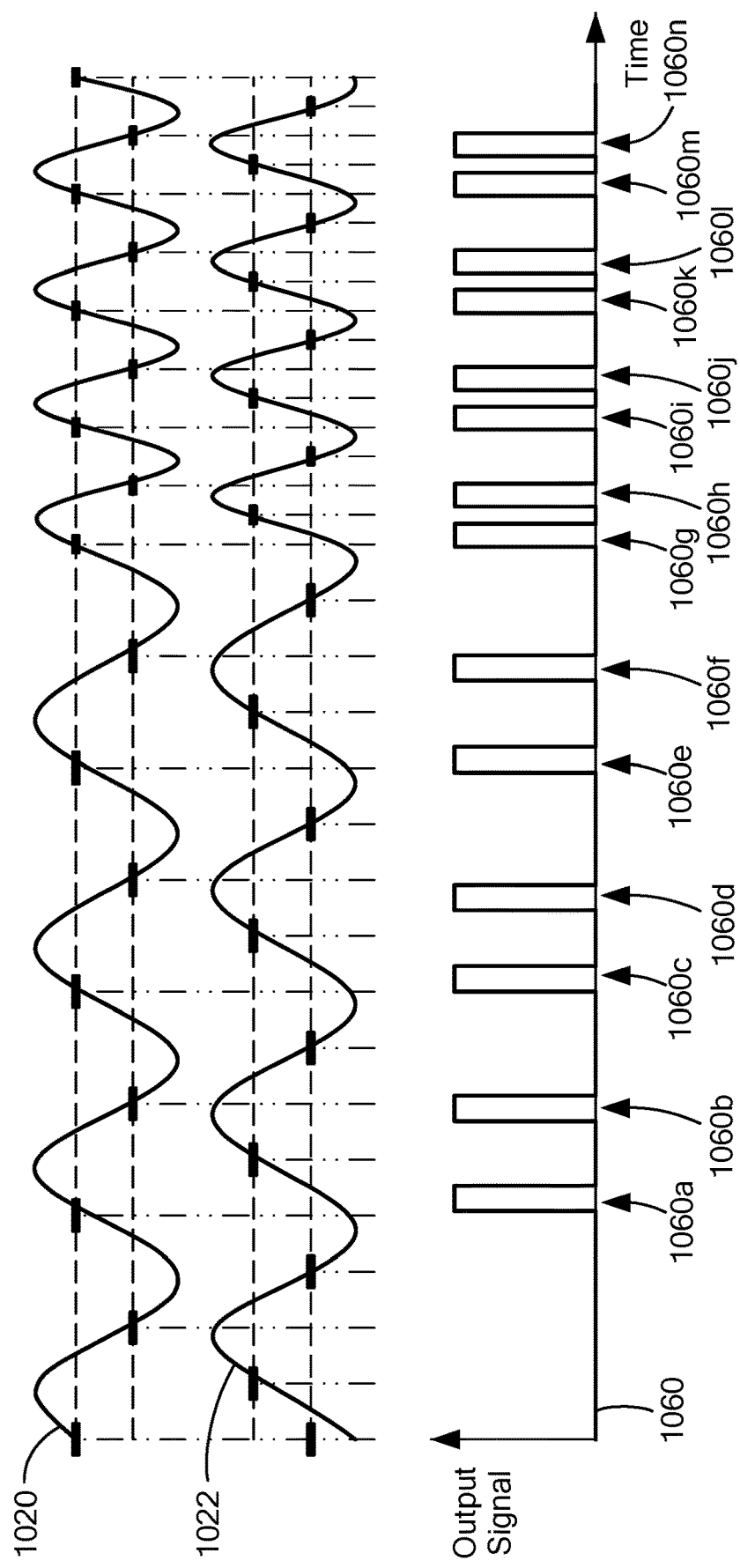
FIG. 10 is a set of graphs showing magnetic field signals and a corresponding output signal indicative of a speed and/or a direction of rotation of an object, where the time between a falling edge of the first pulse and a rising edge of the second pulse provides the indication of range.

FIG. 10 is a set of graphs showing magnetic field signals 1020, 1040 and a corresponding sensor output signal 1060 indicative of speed (and optionally also direction) of rotation of an object, where the time between a falling edge of the first pulse and a rising edge of the second pulse provides the indication of range. Magnetic field signals 1020, 1040 can be magnetic field signals generated by sensor 10 (FIG. 1) or sensor 200 (FIG. 2) and can be the same as or substantially similar to magnetic field signals 420, 440 in FIG. 4, magnetic field signals 520, 540 in FIG. 5, and magnetic field signals 712, 714 in FIG. 7. The output signal 1060 comprises a plurality of output pulse-pairs 1060a-1060b, 1060c-1060d, 1060e-1060f, 1060g-1060h, 1060i-1060j, 1060k-1060l, and 1060m-1060n, where the time between a falling edge of the first pulse and a rising edge of the second pulse in each pulse pair provides an indication of the range of speed of the object. For example, the time between the falling edge of the first pulse 1060a and the rising edge of the second pulse 1060b of pulse pair 1060a-1060b is a first amount of time to indicate the first (low-speed) range, and the amount of time between the falling edge of the first pulse 1060g and the second pulse 1060h of pulse pair 1060g-1060h is a second amount of time which is different than the first amount of time to indicate the second (high-speed) range. Note that pulses 1060a-1060f are in the first range and pulses 1060g-1060n are in the second range.

Figure 11:
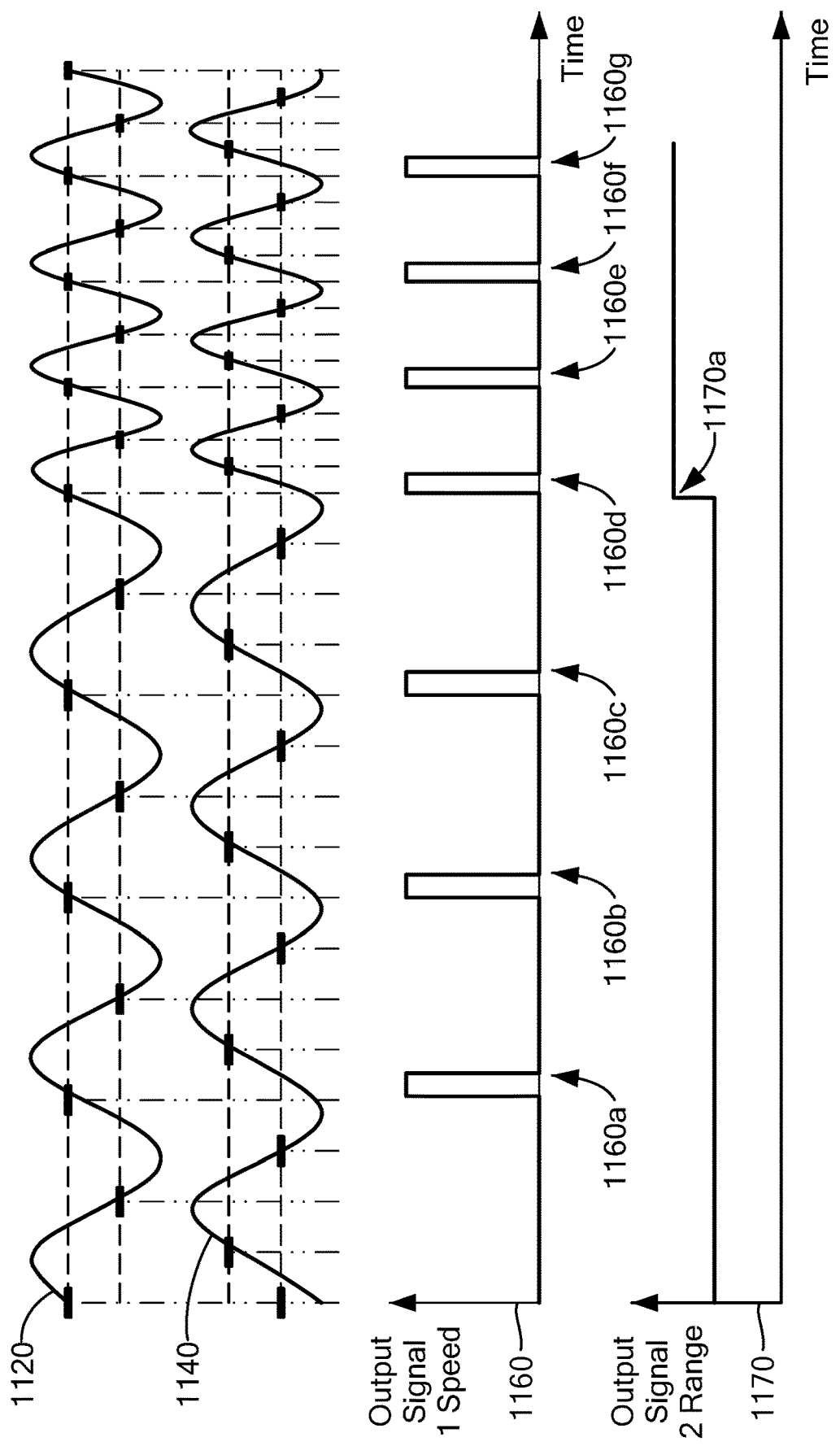
FIG. 11 is a set of graphs showing magnetic field signals and corresponding output signals, with a first output signal providing speed information as a plurality of pulses and a second output signal providing an indication of range of the first output signal as a binary signal.
Figure 12:
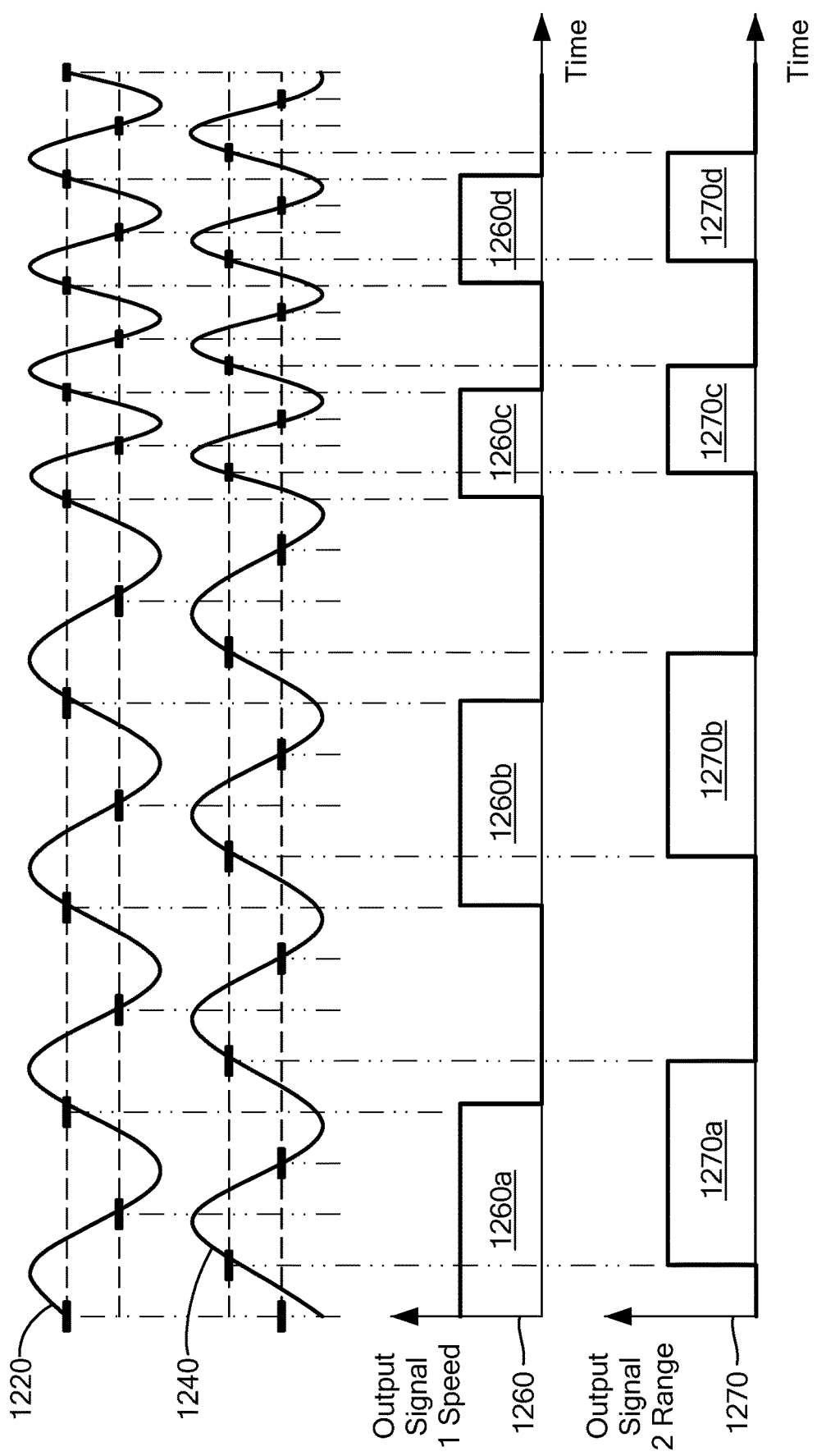
FIG. 12 is a set of graphs showing magnetic field signals and corresponding output signals, with a first output signal providing speed information as a plurality of pulses and a second output signal providing an indication of range of the first output signal as a plurality of pulses.
Figure 2:
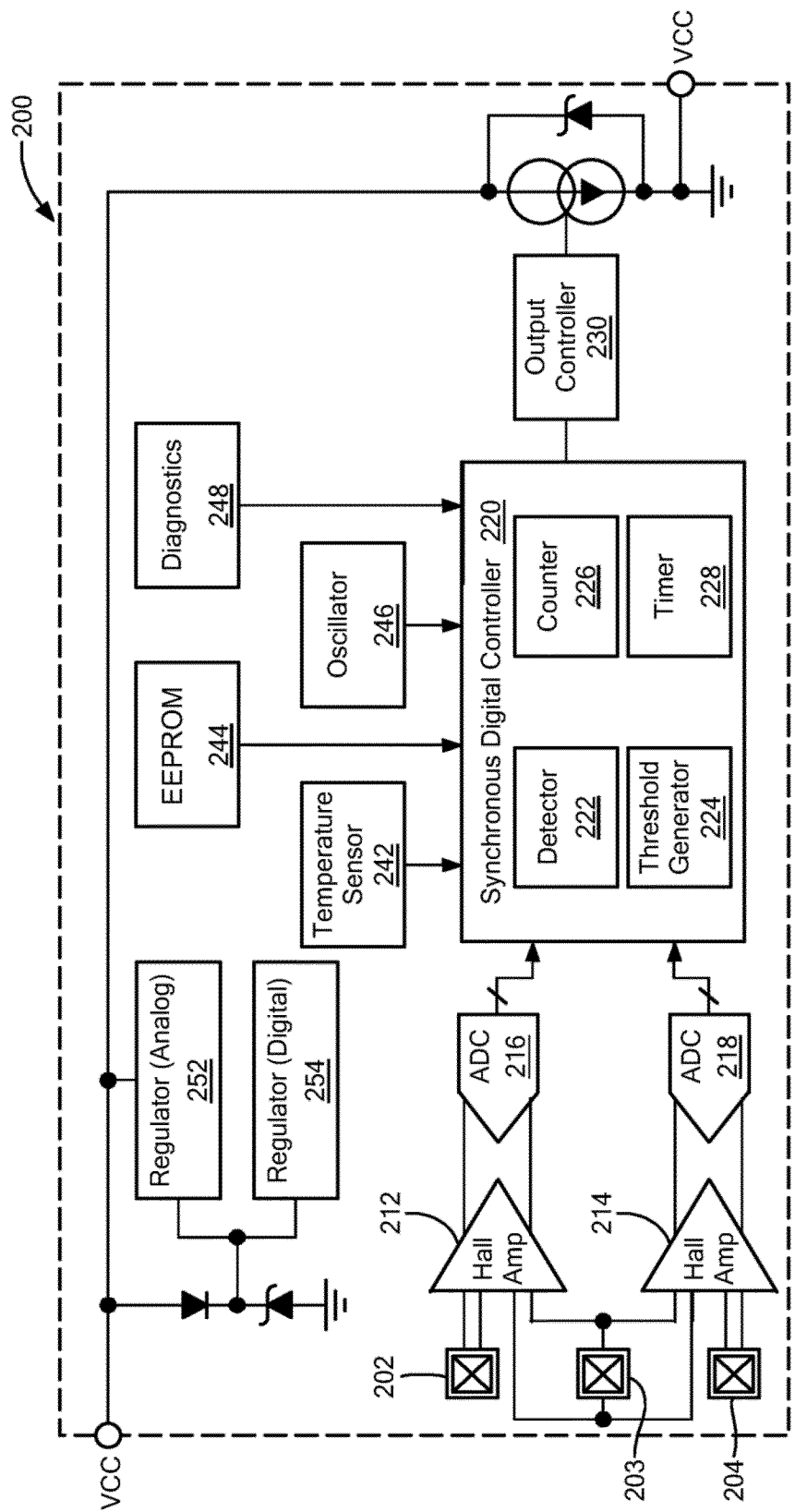
Figure 10:
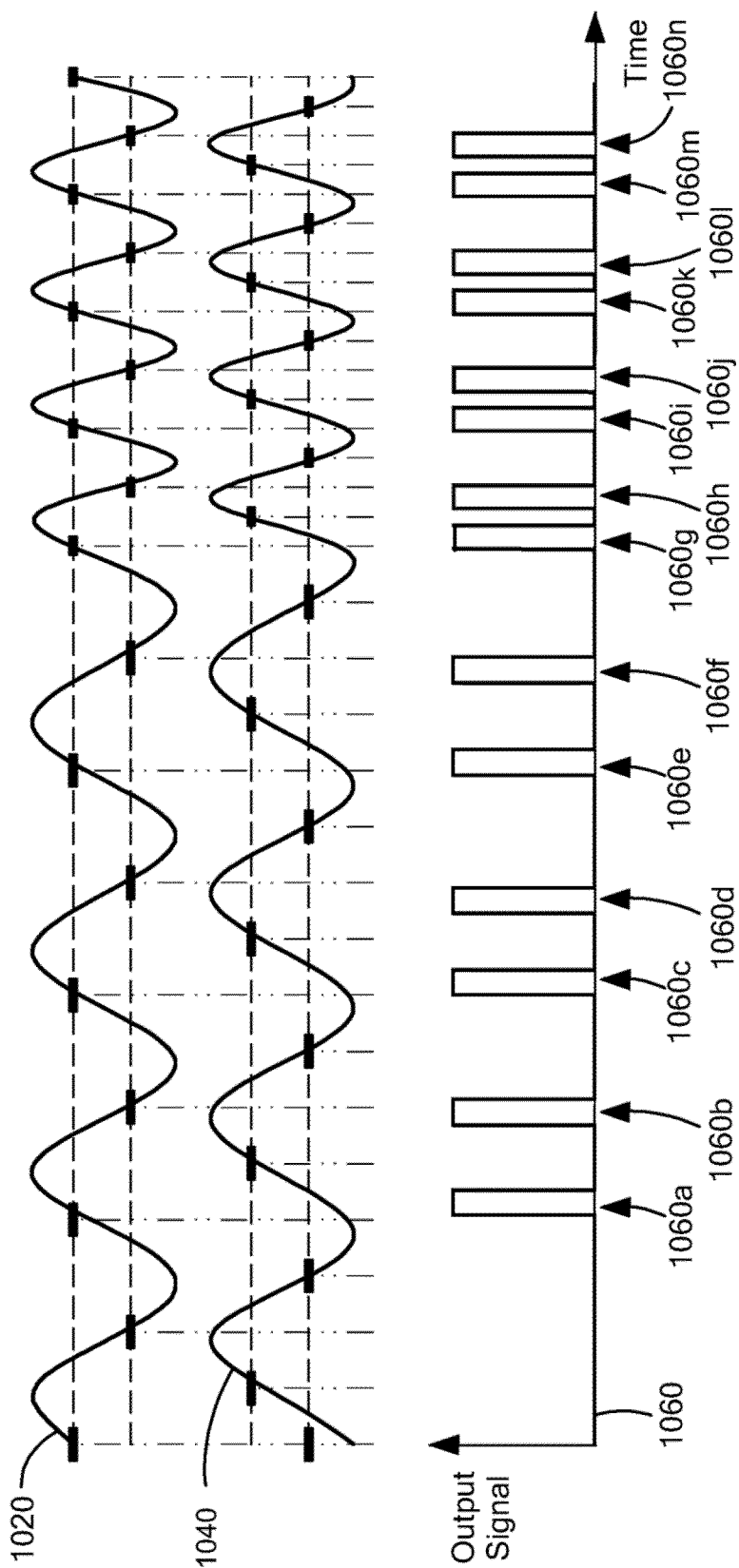

In some cases, it may be desirable to provide a second, separate output line to convey the indication of the range of speed, as shown in FIGS. 11-12, where the first output signal conveys speed information (and optionally also direction) and the second output signal conveys the indication of the range of magnetic field signal. FIG. 11 is a set of graphs showing magnetic field signals 1120, 1140 and at least two corresponding sensor output signals 1160, 1170, with a first output signal 1160 providing speed information as a plurality of pulses and a second output signal 1170 providing an indication of range of the first output signal as a line graph. Magnetic field signals 1120, 1140 can be magnetic field signals generated by sensor 10 (FIG. 1) or sensor 200 (FIG. 2) and can be the same as or substantially similar to magnetic field signals 420, 440 in FIG. 4, magnetic field signals 520, 540 in FIG. 5, and magnetic field signals 712, 714 in FIG. 7. As shown, pulses 1160a, 1160b, 1160c are in the first range and pulses 1160d, 1160e, 1160f, and 1160g are in the second range, however each individual pulse is the same. As such, the second output signal 1170 provides the range of speed information to indicate the range of speed to which the output pulses 1160 correlate.

FIG. 12 is a set of graphs showing magnetic field signals 1220, 1240 and at least two corresponding output signals 1260, 1270, with a first output signal 1260 providing speed information as a plurality of pulses and a second output signal 1270 providing an indication of range of the first output signal as a plurality of pulses. Magnetic field signals 1220, 1240 can be magnetic field signals generated by sensor 10 (FIG. 1) or sensor 200 (FIG. 2) and can be the same as or substantially similar to magnetic field signals 420, 440 in FIG. 4, magnetic field signals 520, 540 in FIG. 5, and magnetic field signals 712, 714 in FIG. 7. As shown, pulses 1260a-1260d provide speed information and pulses 1270a-1270d provide an indication of the range of the speed information. In this example, output signal 1260 is generated from magnetic field signal 1220, and output signal 1270 is generated from magnetic field signal 1240. The phase delay between the two signals 1260, 1270 changes based on the frequency range. The phase delay is the amount of time between rising edges on two signals divided by the time of a single period on one channel.

U.S. patent application Ser. No. 15/596,514, entitled "Magnetic Field Sensors and Output Signal Formats For A Magnetic Field Sensor," which is assigned to the assignee of the present disclosure, is incorporated herein by reference in its entirety. All references cited herein are hereby incorporated herein by reference in their entirety.

It will be appreciated that the magnetic field sensor and output protocol techniques can be implemented for sensors requiring high resolution at low frequencies and lower resolution at high frequencies, for example wheel speed sensors. Likewise, the techniques herein are applicable to sensors used in applications requiring high peak frequencies in case of system failure, for example HEV (Hybrid Electric Vehicle) applications. In this case, the standard speed-range might cover an entire operating specification for a sensor, with additional speed ranges being applicable for out of specification operation. This might serve as a safety measure for sensor components used in safety critical applications.

Having described preferred embodiments of the present disclosure, it will now become apparent to one of ordinary skill in the art that other embodiments incorporating their concepts may be used. It is felt therefore that these embodiments should not be limited to disclosed embodiments, but rather should be limited only by the spirit and scope of the appended claims.

What is claimed is:

1. A magnetic field sensor, comprising:
    a magnetic field sensing element configured to generate a magnetic field signal in response to a magnetic field associated with an object having a plurality of features;
    a controller comprising a detector responsive to an amplified signal generated using at least the magnetic field signal and to a threshold signal and configured to generate a detector signal having edges occurring in response to a comparison of the amplified signal and the threshold signal and occurring at a rate corresponding to a speed of motion of the object, the controller configured to determine if a frequency of the magnetic field signal is within a first range or a second range; and
    an output circuit coupled to receive the detector signal and configured to generate, on a first output line, an output signal having a first format responsive to the determination being that the frequency of the magnetic field signal is within the first range and having a second format different than the first format responsive to the determination being that the frequency of the magnetic field signal is within the second range, different than the first range, wherein the first output signal format comprises a first predetermined amount of pulses for each feature of the object and wherein the second output signal format comprises a second predetermined amount of pulses for each feature of the object, wherein the second predetermined amount of pulses is different than the first predetermined amount of pulses, the output circuit further configured to provide, on a second output line, an indication of whether the frequency of the magnetic field signal is within the first range or within the second range.

2. The magnetic field sensor of claim 1, wherein the first range of the magnetic field signal corresponds to a first range of frequencies and wherein the second range of the magnetic field signal corresponds to a second range of frequencies, wherein the second range of frequencies is higher than the first range of frequencies.

3. The magnetic field sensor of claim 1, wherein each feature of the object comprises a pole pair of a ring magnet or a tooth valley pair of a gear.

4. The magnetic field sensor of claim 1, wherein the output signal comprises a first output signal and wherein the output circuit is configured to provide the indication of the range of the frequency of the magnetic field signal as a second output signal on the second output line.

5. The magnetic field sensor of claim 4, wherein the first output signal is configured to convey information about the speed of motion of the object.

6. The magnetic field sensor of claim 4, wherein a voltage level or a current level of the second output signal provides the indication of the range of the frequency of the magnetic field signal.

7. The magnetic field sensor of claim 5, wherein a phase delay between the first output signal and the second output signal provides the indication of the range of the frequency of the magnetic field signal.

8. A method comprising:
    generating a magnetic field signal in response to a magnetic field associated with an object having a plurality of features;
    generating a detector signal having edges occurring in response to a comparison of an amplified signal generated using at least the magnetic field signal and to a threshold signal and occurring at a rate corresponding to a speed of motion of the object;
    determining if a frequency of the magnetic field signal is within a first range or a second range; and
    generating, on a first output line, an output signal having a first format comprising a first predetermined amount of pulses for each feature of the object responsive to the determination being that the frequency of the magnetic field signal is within the first range and having a second format comprising a second predetermined amount of pulses for each feature of the object different than the first predetermined amount of pulses responsive to the determination being that the frequency of the magnetic field signal is within the second range, different than the first range; and
    providing, on a second output line, an indication of whether the frequency of the magnetic field signal is within the first range or within the second range.

9. The method of claim 8, further comprising setting a counter to a value, and incrementing the counter in response to the edges of the detector signal.

10. The method of claim 9, wherein generating the output signal comprises providing an output pulse of the output signal when the counter reaches the value.

11. The method of claim 8, further comprising determining if the frequency of the magnetic field signal is within the first range or the second range using an internal clock to determine the frequency with which the magnetic field signal changes.

12. An apparatus comprising:
    means for generating a magnetic field signal in response to a magnetic field associated with an object having a plurality of features;
    means for generating a detector signal having edges occurring in response to a comparison of an amplified signal generated using at least the magnetic field signal and to a threshold signal and occurring at a rate corresponding to a speed of motion of the object;
    means for determining if the speed of the motion of the object is within a first range or a second range; and output means for generating, on a first output line, an output signal having a first format responsive to the determination being that the speed of motion of the object is within a first range and having a second format different than the first format responsive to the determination being that the speed of motion of the object is within a second range, different than the first range, wherein the first output signal format comprises a first predetermined amount of pulses for each feature of the object and wherein the second output signal format comprises a second predetermined amount of pulses for each feature of the object, wherein the first predetermined amount of pulses is different than the second predetermined amount of pulses, the output means further for providing, on a second output line, an indication of whether the speed of the motion of the object is within the first range or within the second range.

13. The magnetic field sensor of claim 1, wherein the second predetermined amount of pulses comprises one-half of the first predetermined amount of pulses.

14. The magnetic field sensor of claim 1, wherein the second predetermined amount of pulses comprises one-quarter of the first predetermined amount of pulses.

* * * * *

UNITED STATES PATENT AND TRADEMARK OFFICE
CERTIFICATE OF CORRECTION

PATENT NO. : 11,686,597 B2
APPLICATION NO. : 16/434649
DATED : June 27, 2023
INVENTOR(S) : Dominik Weiland et al.

It is certified that error appears in the above-identified patent and that said Letters Patent is hereby corrected as shown below:

In the Drawings

Please replace Fig. 2 with Fig. 2 as shown on the attached page.

Please replace Fig. 10 with Fig. 10 as shown on the attached page.

In the Specification

Column 9, Line 55 delete "38b, 38c" and replace with --38a, 38b--.

Column 10, Line 2 delete "trey." and replace with --trev.--.

Column 10, Line 3 delete "trey," and replace with --trev,--.

Column 10, Line 4 delete "trey," and replace with --trev,--.

Column 10, Line 8 delete "trey," and replace with --trev,--.

Column 10, Line 9 delete "trey," and replace with --trev,--.

Column 10, Line 10 delete "44" and replace with --84--.

Column 10, Line 34 delete "trey," and replace with --trev,--.

Column 10, Line 35 delete "trey," and replace with --trev,--.

Column 10, Line 55 delete "trey," and replace with --trev,--.

Signed and Sealed this
Fourteenth Day of May, 2024

*Katherine Kelly Vidal*
*Director of the United States Patent and Trademark Office*

Column 10, Line 57 delete "trey," and replace with --trev,--.

Column 15, Line 8 delete "420,450)," and replace with --420, 440),--.